(12) United States Patent
Takubo et al.

(10) Patent No.: US 8,643,927 B2
(45) Date of Patent: Feb. 4, 2014

(54) MEMS DEVICE AND METHOD OF MANUFACTURING MEMS DEVICE

(75) Inventors: Chisaki Takubo, Kodaira (JP); Heewon Jeong, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 382 days.

(21) Appl. No.: 13/178,480

(22) Filed: Jul. 7, 2011

(65) Prior Publication Data

US 2012/0038963 A1    Feb. 16, 2012

(30) Foreign Application Priority Data

Aug. 12, 2010  (JP) ................................. 2010-181108

(51) Int. Cl.
*G02B 26/08*  (2006.01)
(52) U.S. Cl.
USPC ....................................... 359/224.1; 359/904
(58) Field of Classification Search
USPC .......... 359/198.1–199.4, 200.6–200.8, 202.1, 359/221.2, 223.1–225.1, 226.2, 904, 359/290–295, 838, 846, 871, 872; 250/204, 250/559.06, 559.29, 230, 234; 347/255–260; 353/39, 98–99; 385/15–18, 22; 398/12, 19, 45

See application file for complete search history.

(56) References Cited

U.S. PATENT DOCUMENTS

| 2009/0020419 A1 | 1/2009 | Suzuki et al. | |
| 2009/0231671 A1* | 9/2009 | Yang et al. | 359/291 |

FOREIGN PATENT DOCUMENTS

| JP | 11-173851 A | 7/1999 |
| JP | 3551821 B2 | 5/2004 |
| JP | 2005-241500 A | 9/2005 |
| JP | 2009-27016 A | 2/2009 |

* cited by examiner

*Primary Examiner* — Jennifer L. Doak
(74) *Attorney, Agent, or Firm* — Miles & Stockbridge P.C.

(57) ABSTRACT

A protrusion formation hole is provided so as to pierce a support substrate. A polysilicon film as an electrical conducting material is embedded in the protrusion formation hole through an oxide silicon film. The polysilicon film partially bulges out of the protrusion formation hole toward a movable section to form a protruding section. In other words, the polysilicon film bulges out of the protrusion formation hole toward the movable section to form the protruding section. Thereby, a movable section included in MEMS can be prevented from sticking to other members.

16 Claims, 26 Drawing Sheets

INITIAL STATE

DISPLACED IN THE +Z DIRECTION

DISPLACED IN THE −Z DIRECTION

INITIAL STATE

DISPLACED IN THE +Z DIRECTION

DISPLACED IN THE −Z DIRECTION

MEMS DEVICE AND METHOD OF MANUFACTURING MEMS DEVICE

CLAIM OF PRIORITY

The present application claims priority from Japanese patent application JP 2010-181108 filed on Aug. 12, 2010, the content of which is hereby incorporated by reference into this application.

FIELD OF THE INVENTION

The present invention relates to a MEMS (microelectromechanical systems) device and its manufacturing technology. More particularly, the invention relates to a MEMS device formed on an SOI substrate and a technology effectively applicable to a manufacturing technology of the system.

BACKGROUND OF THE INVENTION

Japanese Unexamined Patent Application Publication No. 2009-027016 describes the technology that forms a MEMS (Micro Electro Mechanical Systems) structure and a through-hole on an SOI substrate.

According to the description of the Japanese Unexamined Patent Application Publication No. Hei11 (1999)-173851, the angular rate sensor keeps the oscillator oscillating in the first direction using the movable drive electrode and the unmovable drive electrode. The oscillator is displaced in a direction orthogonal to the first direction in accordance with an angular rate around the Z axis. The movable drive electrode and the unmovable drive electrode detect the displacement. Stoppers provided on the substrate regulate the oscillator displacement in the second direction while the connection section keeps the stoppers the same potential as the oscillator. The stoppers prevent contact between the movable drive electrode and the unmovable drive electrode and between movable detection electrode and the unmovable detection electrode.

According to the technology described in Japanese Patent No. 3551821, an SOI substrate includes bottom, intermediate, and top layers. The top layer is processed to form a movable section. The intermediate layer immediately below the movable section is wet-etched and removed. At this time, the intermediate layer is partly unremoved to form a stopper containing a protrusion.

According to the technology described in Japanese Unexamined Patent Application Publication No. 2005-241500, the bottom capacity detection electrode is formed on a semiconductor substrate. The movable section is formed on the bottom capacity detection electrode through a hollow section. The movable section and the bottom capacity detection electrode configure the capacitative element. A capacity change in the capacitative element is used to detect the displacement of the movable section in the thickness direction of the semiconductor substrate.

SUMMARY OF THE INVENTION

According to one aspect of the present invention, processing of an SOI substrate forms a MEMS device. Specifically, the SOI substrate includes a support substrate, an intermediate insulation layer formed on the support substrate, and an active layer formed on the intermediate insulation layer. Processing the active layer of the SOI substrate forms a MEMS structure. For example, the MEMS structure includes an elastically deformable elastic deformation section (beam), a movable section connected to one end of the elastic deformation section, and an unmovable section connected to the other end of the elastic deformation section. The MEMS structure eliminates an intermediate insulation layer from below the elastic deformation section and the movable section. The elastic deformation section is configured to be elastically deformable. The movable section is configured to be capable of being displaced. The intermediate insulation layer formed below the unmovable section remains. The unmovable section is fastened to the support substrate through the remaining intermediate insulation layer.

For example, the above-mentioned MEMS provides an angular rate sensor or an acceleration sensor that detects the physical quantity such as an angular rate or an acceleration based on the movable section displacement. The MEMS also provides a micromirror capable of adjusting the angle or position of a mirror (movable section) based on the movable section displacement. The MEMS further provides a microlens actuator capable of adjusting the focal position of a microlens.

It is important to configure the MEMS so that the movable section can be displaced. If the movable section is displaced too much, however, it may touch and stick to other members. For example, let us consider that the movable section is displaced in the thickness direction of the SOI substrate. If the movable section is displaced too much, the movable section displacement exceeds a gap distance equivalent to the intermediate insulation layer removed from between the movable section and the support substrate. Consequently, the movable section touches the support substrate. The movable section then sticks to the support substrate and cannot be displaced subsequently. As a result, the MEMS may not operate normally.

It is an object of the present invention to provide a technology that can prevent a movable section included in the MEMS from sticking to other members.

These and other objects and novel features of the invention may be readily ascertained by referring to the following description and appended drawings.

The following summarizes the representative aspects of the invention disclosed in this application.

A MEMS device manufacturing method according to one aspect of the invention includes the following steps. Step (a) provides an SOI substrate including a support substrate, an intermediate insulation layer formed on the support substrate, and an active layer formed on the intermediate insulation layer. After the step (a), step (b) forms a protrusion formation hole in a movable section formation region of the SOI substrate so as to pierce the support substrate and expose the intermediate insulation layer. After the step (b), step (c) removes the intermediate insulation layer exposed from the protrusion formation hole to expose the active layer from the protrusion formation hole. After the step (c), step (d) oxidizes the active layer exposed from the protrusion formation hole and an inner wall of the protrusion formation hole to form a first oxidation layer on a surface of the active layer and the inner wall of the protrusion formation hole. After the step (d), step (e) embeds a conductive film in the protrusion formation hole. After the step (e), step (f) patterns the active layer of the SOI substrate to form an elastic deformation section of a MEMS sensor, a movable section connected to one end of the elastic deformation section, and an unmovable section connected to the other end of the elastic deformation section. After the step (f), step (g) removes the intermediate insulation layer from the movable section formation region forming the movable section and the elastic deformation section formation region forming the elastic deformation section to suspend the movable section using the elastic deformation section, partially exposes the conductive film embedded in the protrusion formation hole to form a protruding section including part of the conductive film, and removes the first oxidation layer in contact with the protruding section to form a gap between the protruding section and the movable section.

A MEMS device manufacturing method according to the aspect of the invention includes the following steps. Step (a) provides an SOI substrate including a support substrate, an intermediate insulation layer formed on the support substrate, and an active layer formed on the intermediate insulation layer. After the step (a), step (b) forms multiple protrusion formation holes in a movable section formation region of the SOI substrate so as to pierce the support substrate and expose the intermediate insulation layer. After the step (b), step (c) removes the intermediate insulation layer exposed from the protrusion formation holes to expose the active layer from the protrusion formation holes. After the step (c), step (d) oxidizes the active layer exposed from the protrusion formation holes and inner walls of the protrusion formation holes to form a first oxidation layer on a surface of the active layer and the inner walls of the protrusion formation hole. After the step (d), step (e) embeds a conductive film in the protrusion formation holes. After the step (e), step (f) patterns the active layer of the SOI substrate to form an elastic deformation section of a MEMS sensor, a movable section connected to one end of the elastic deformation section, and an unmovable section connected to the other end of the elastic deformation section. After the step (f), step (g) removes the intermediate insulation layer from the movable section formation region forming the movable section and the elastic deformation section formation region forming the elastic deformation section to suspend the movable section using the elastic deformation section, partially exposes the conductive film embedded in the protrusion formation holes to form multiple protruding sections including part of the conductive film, and removes the first oxidation layer in contact with the protruding sections to form a gap between the protruding sections and the movable section. The step (b) forms the protrusion formation holes for surrounding a first region of the support substrate formed on the SOI substrate in order to electrically separate the first region from a second region of the support substrate formed on the SOI substrate.

A MEMS device according to another aspect of the invention includes: (a) an SOI substrate including a support substrate, intermediate insulation layer portions disposed on the support substrate, and an active layer having portions disposed on the intermediate insulation layer portions; and (b) an elastic deformation section having a first portion of the active layer spaced from the support substrate. Further, the MEMS device includes (c) a movable section having a second portion of the active layer spaced from the support substrate, and being connected to one end of the elastic deformation section. Furthermore, the MEMS device includes: (d) an unmovable section having a third portion of the active layer and being fixed to the support substrate through a portion of the intermediate insulation layer below the third portion of the active layer, and being connected to the other end of the elastic deformation section; and (e) a stopper section arranged so as to prevent the movable section from sticking to the support substrate. According to one preferred mode, the stopper section includes: (e1) a protrusion formation hole provided so as to pierce the support substrate; (e2) an oxidation layer formed on an inner wall of the protrusion formation hole; (e3) a conductive film embedded in the protrusion formation hole through the oxidation layer; and (e4) a protruding section including part of the conductive film bulging out of the protrusion formation hole toward the movable section. A distance between the protruding section and the movable section is smaller than a distance between the support substrate and the movable section.

The following summarizes a representative effect of the invention disclosed in this specification.

A movable section included in the MEMS can be prevented from contacting with other members.

DETAILED DESCRIPTION OF THE PREFERRED EMBODIMENTS

Figure 1:
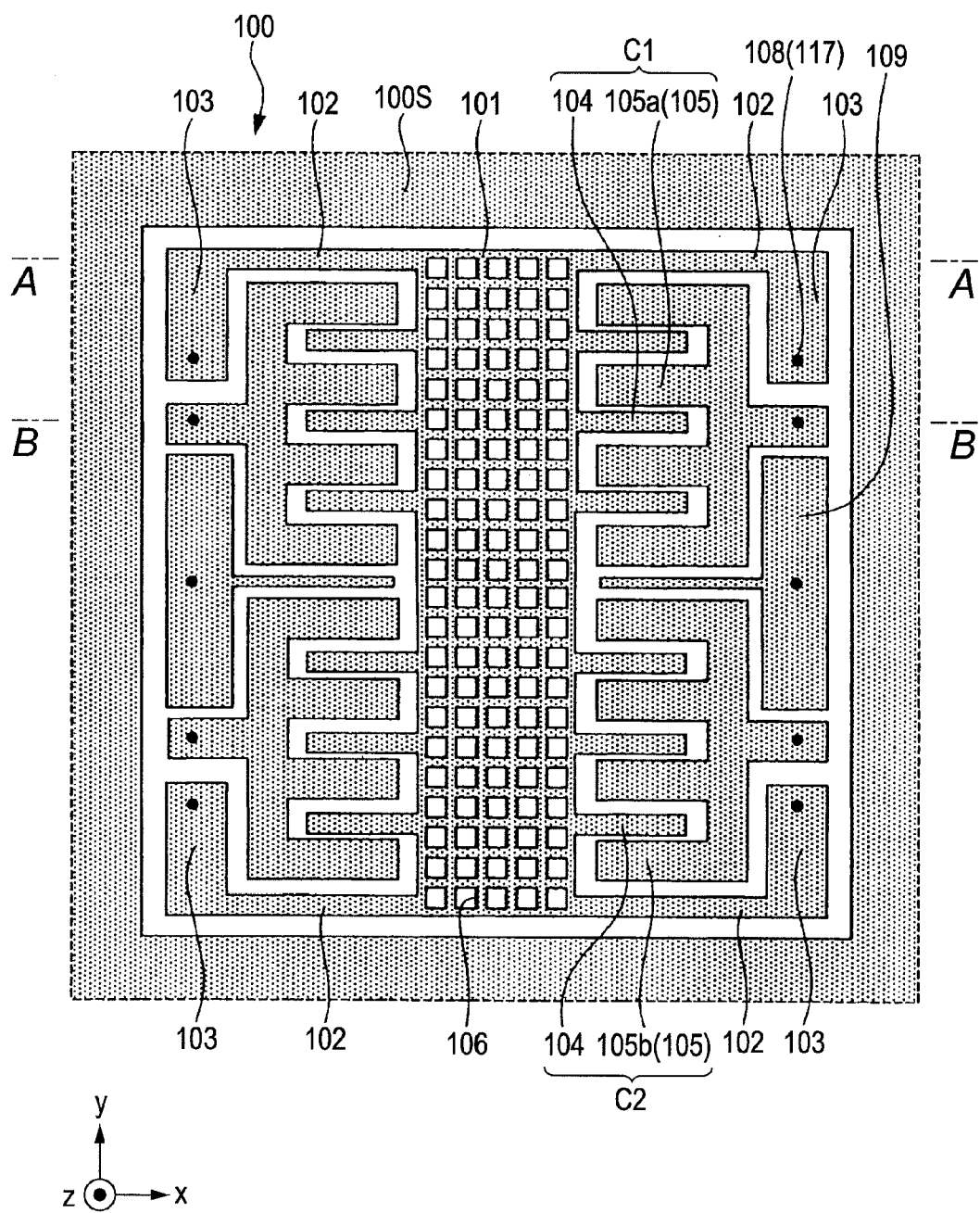
FIG. 1 is a top view showing a configuration of an acceleration sensor according to a first embodiment of the invention.

The following description includes multiple embodiments or sections as needed. Unless expressly stated otherwise, the embodiments are not unrelated to each other. One of the embodiments provides modifications, details, or supplements for all or part of the others.

The embodiments to be described may refer to numeric values including the number of elements or items, quantities, and ranges. The embodiments are not limited to but may be greater or smaller than specific numeric values, unless expressly stated otherwise, or unless the embodiments are limited to specific numeric values in principle.

Obviously, constituent elements including procedure steps are not necessarily requisite for the embodiments, unless expressly stated otherwise, or unless the elements are requisite in principle.

The embodiments include those virtually approximate to or similar to shapes and positional relation of the constituent elements stated in the description, unless expressly stated otherwise, or unless considered inappropriate in principle. The same applies to the above-mentioned numeric values and ranges.

Throughout the drawings for illustrating the embodiments, the same elements when shown in more than one figure are designated by the same reference numerals as a general rule and a repetitive description is omitted for simplicity. Even a plan view may contain a shaded portion for easy understanding of the drawing.

First Embodiment

The first embodiment describes a capacitance acceleration sensor as an example of the MEMS device. FIG. 1 is a top view showing a configuration of an acceleration sensor 100 according to the first embodiment. In FIG. 1, the acceleration sensor 100 according to the first embodiment is formed on an SOI substrate 100S. The SOI substrate 100S includes a support substrate, an intermediate insulation layer formed on the support substrate, and an active layer (silicon layer) formed on the intermediate insulation layer. FIG. 1 shows a processed shape on the side of the active layer (silicon layer).

As shown in FIG. 1, the acceleration sensor 100 according to the first embodiment includes a movable section 101, a beam (elastic deformation section) 102, and an unmovable section 103. The movable section 101 is connected to the unmovable section 103 through the beam 102. The movable section 101 can be displaced in accordance with acceleration acting on the acceleration sensor 100. Specifically, the beam 102 is configured to be elastically deformable. The movable section 101 is connected to one end of the beam 102. The unmovable section 103 is connected to the other end of the beam 102. For example, applying acceleration in the y direction elastically deforms the beam 102. The movable section 101 connected to the elastically deforming beam 102 is displaced in the y direction. Applying acceleration in the y direction to the acceleration sensor 100 according to the first embodiment elastically deforms the beam 102 to displace the movable section 101 in the y direction while the movable section 101 is connected to one end of the beam. When acceleration is applied in the y direction to the acceleration sensor 100 according to the first embodiment, the movable section 101 is displaced in the y direction in accordance with the magnitude and the direction of the acceleration.

Processing the active layer of the SOI substrate 100S forms the movable section 101. The intermediate insulation layer formed below the active layer included in the movable section 101 is removed so that the movable section 101 can be displaced. For this reason, the movable section 101 is provided with an etching hole 106 in order to easily remove the intermediate insulation layer below the movable section 101. In other words, the etching hole 106 is provided for the movable section 101 in order to easily remove the intermediate insulation layer below the movable section 101 through etching.

A movable electrode 104 is formed so as to be integrated with the movable section 101. An unmovable electrode 105 is formed so as to face the movable electrode 104. As shown in FIG. 1, for example, six movable electrodes 104 protrude from the right side of the movable section 101. Another six movable electrodes 104 protrude from the left side of the movable section 101. A comblike unmovable electrode 105*a* is formed so as to face three movable electrodes 104 on an upper part (in the +y direction) of the six movable electrodes 104 protruding from the right side of the movable section 101. Likewise, a comblike unmovable electrode 105*b* is formed so as to face three movable electrodes 104 on a lower part (in the −y direction) of the six movable electrodes 104 protruding from the right side of the movable section 101. A dummy pattern 109 is formed between the unmovable electrodes 105*a* and 105*b*.

The movable electrode 104 and the unmovable electrode 105*a* form a capacitative element C1. The unmovable electrode 105*a* is formed so as to face the three upper movable electrodes 104. In this state, the capacitative element (capacitor) C1 is formed so as to include the unmovable electrode 105*a* as an upper electrode (+y direction electrode) and the movable electrode 104 as a lower electrode (−y direction electrode).

The movable electrode 104 and the unmovable electrode 105*b* form a capacitative element C2. The unmovable electrode 105*b* is formed so as to face the three lower movable electrodes 104. In this state, the capacitative element (capacitor) C2 is formed so as to include the movable electrode 104 as an upper electrode (+y direction electrode) and the unmovable electrode 105*b* as a lower electrode (−y direction electrode).

In the acceleration sensor 100 according to the first embodiment, the movable section 101 is connected to the unmovable section 103 through the beam 102. The movable section 101, the beam 102, and the unmovable section 103 are made of conductive active layers (silicon layers). The movable section 101, the beam 102, and the unmovable section 103 are therefore connected mechanically and electrically. A through-hole 108 is formed in the unmovable section 103 and is filled with an electrical conducting material to form a through-hole electrode 117. The through-hole is also formed in the unmovable electrodes 105*a* and 105*b* and the dummy pattern 109 and is filled with an electrical conducting material to form the through-hole electrode 117.

Figure 2:
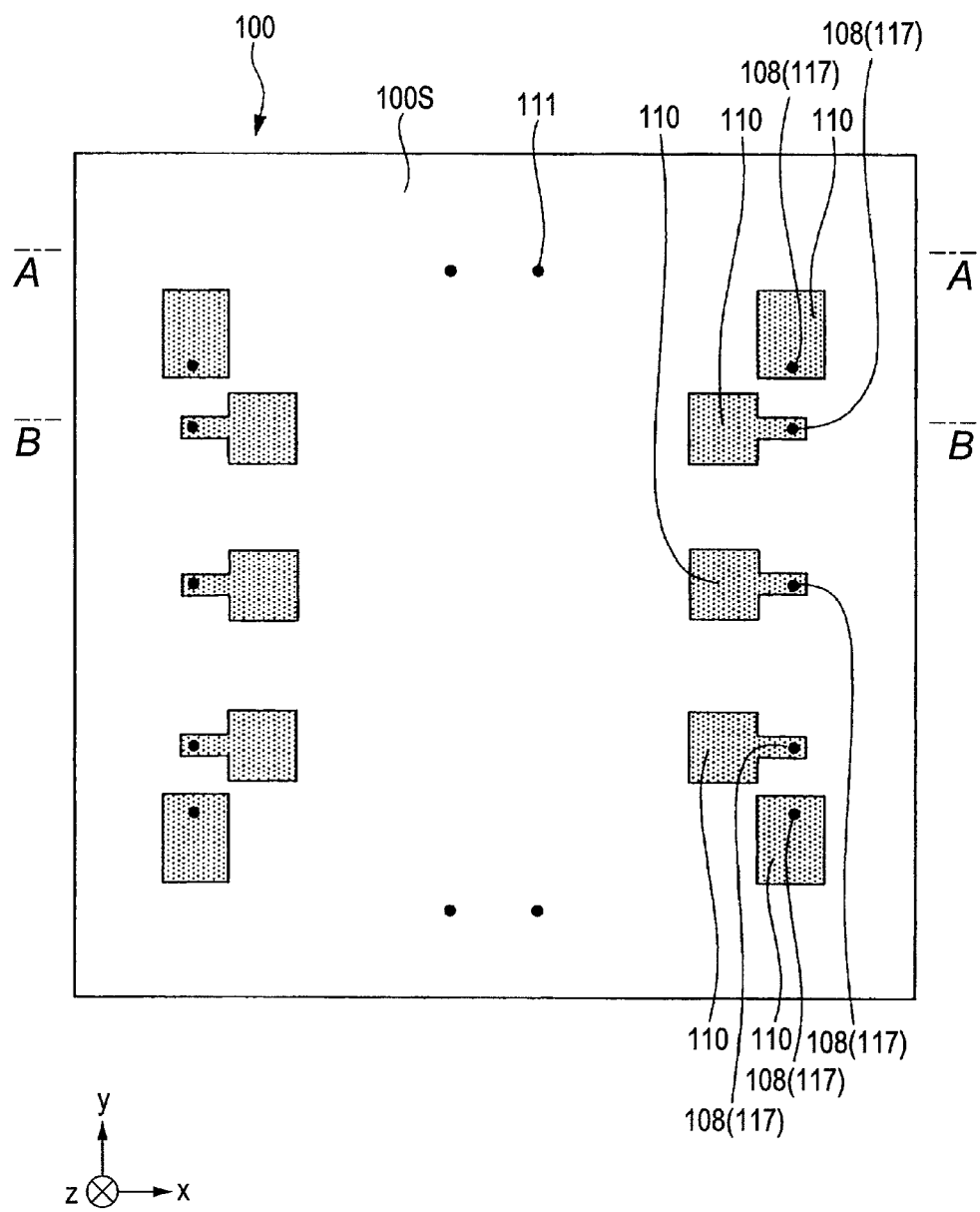
FIG. 2 is a bottom view showing a configuration of the acceleration sensor according to the first embodiment.

FIG. 2 is a bottom view showing a configuration of the acceleration sensor 100 according to the first embodiment. As shown in FIG. 2, the acceleration sensor 100 according to the first embodiment is formed on the SOI substrate 100S. The SOI substrate 100S includes a support substrate, an intermediate insulation layer formed on the support substrate, and an active layer (silicon layer) formed on the intermediate insulation layer. FIG. 2 shows a processed shape on the support substrate side.

As shown in FIG. 2, the through-hole 108 is formed on the support substrate side of the SOI substrate 100S and is filled with an electrical conducting material to form the through-hole electrode 117. The through-hole electrode 117 is electrically connected to an electrode 110 formed on the support substrate. With reference to FIGS. 1 and 2, the movable section 101 in FIG. 1 is electrically connected to the unmovable section 103 through the beam 102. The unmovable section 103 is electrically connected to the electrode 110 formed on the support substrate side through the through-hole electrode 117. Similarly, the unmovable electrode 105*a* in FIG. 1 is electrically connected to another electrode 110 formed on the support substrate side through another through-hole electrode 117. The unmovable electrode 105*b* in FIG. 1 is electrically connected to yet another electrode 110 formed on the support substrate side through yet another through-hole electrode 117.

As seen from this configuration, the movable section 101 (movable electrode 104), the unmovable electrode 105*a*, and the unmovable electrode 105*b* in FIG. 1 are connectable to an external circuit through the discrete electrodes 110.

As shown in FIG. 2, a protrusion formation hole 111 is formed on the support substrate side of the SOI substrate 100S and is filled with an electrical conducting material. A characteristic of the acceleration sensor 100 according to the first embodiment is to provide the protrusion formation hole 111 filled with an electrical conducting material. The characteristic structure will be described with reference to FIG. 3A.

Figure 3A:
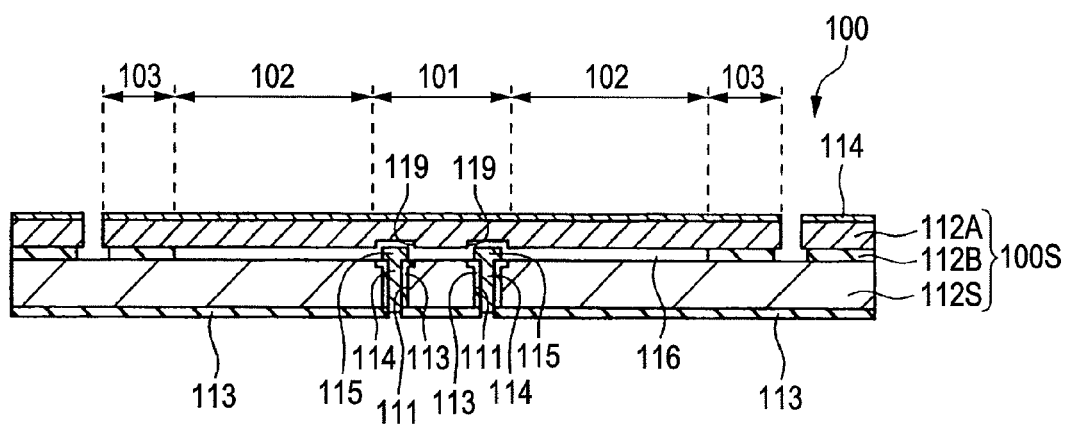
FIG. 3A is a cross sectional view taken along the line A-A of FIGS. 1 and 2.

FIG. 3A is a cross sectional view taken along the line A-A of FIGS. 1 and 2. As shown in FIG. 3A, processing the SOI substrate 100S forms the acceleration sensor 100 according to the first embodiment. The SOI substrate 100S includes a support substrate 112S, an intermediate insulation layer 112B formed on the support substrate 112S, and an active layer 112A formed on the intermediate insulation layer 112B. Specifically, the acceleration sensor 100 according to the first embodiment includes a polysilicon film 114 formed on the active layer (silicon layer) 112A. The active layer 112A and the polysilicon film 114 are integrally processed to form the movable section 101, the beam 102, and the unmovable section 103. The movable section 101 is connected to one end of the beam 102. The unmovable section 103 is connected to the other end of the beam 102. The intermediate insulation layer 112B below the active layer 112A forming the movable section 101 and the beam 102 is removed to form a gap 116. On the other hand, the intermediate insulation layer 112B below the active layer 112A forming the unmovable section 103 remains. The unmovable section 103 is fixed to the support substrate 112S through the intermediate insulation layer 112B.

The protrusion formation hole 111 is formed so as to pierce the support substrate 112S below the active layer 112*a* where the movable section 101 and the beam 102 are formed. An oxide silicon film 113 is formed on the rear surface of the support substrate 112S including an inner wall of the protrusion formation hole 111. The polysilicon film 114 is embedded in the protrusion formation hole 111 through the oxide silicon film 113. Part of the polysilicon film 114 embedded in the protrusion formation hole 111 bulges out of the protrusion formation hole 111 toward the movable section 101 to form a protruding section 115. According to the first embodiment, the protruding section 115 protrudes from the protrusion formation hole 111 into the gap 116 formed by removing the intermediate insulation layer 112B. A recessed section 119 is formed in the active layer 112A (movable section 101) above the protruding section 115 so as to prevent the protruding section 115 from contacting with the active layer 112A.

As a characteristic of the first embodiment, the protrusion formation hole 111 is provided so as to pierce the support substrate 112S. The protrusion formation hole 111 is embedded with the polysilicon film 114 as an electrical conducting material through the oxide silicon film 113. The polysilicon film 114 partially bulges out of the protrusion formation hole 111 toward the movable section 101 to form the protruding section 115. In other words, the first embodiment is characterized in that the polysilicon film 114 bulges out of the protrusion formation hole 111 toward the movable section 101 to form the protruding section 115. According to the first embodiment, the distance between the protruding section 115 and the movable section 101 is shorter than the distance between the support substrate 112S and the movable section 101. This prevents the movable section 101 from contacting with the support substrate 112S. As a result, the movable section 101 can be prevented from sticking to the support substrate 112S. The reason follows.

For example, let us suppose that the protruding section 115 in FIG. 3A is not formed. An external force is applied to the acceleration sensor 100 in the thickness direction of the SOI substrate 100S. In this case, the movable section 101 is displaced in the thickness direction of the SOI substrate 100S. When an external force is small, the movable section 101 causes small displacement. The movable section 101 is displaced within the gap 116 between itself and the support substrate 112S. In this case, the movable section 101 does not contact with the support substrate 112S. When an external force is large, however, the movable section 101 may cause displacement larger than the gap 116. In this case, the movable section 101 contacts with the support substrate 112S. If most part of the area of the movable section 101 contacts with the support substrate 112S, the movable section 101 may stick to the support substrate 112S. After the external force is removed, the movable section 101 remains sticking to the support substrate 112S. Subsequently, the movable section 101 cannot be apart from the support substrate 112S. As a result, the acceleration sensor 100 does not function normally.

According to the first embodiment, as shown in FIG. 3A, the polysilicon film 114 bulges out of the protrusion formation hole 11 toward the movable section 101 to form the protruding section 115. The protruding section 115 keeps the distance between the protruding section 115 and the movable section 101 smaller than the distance between the support substrate 112S and the movable section 101. For example, let us suppose that an external force is applied to the acceleration sensor 101 in the thickness direction of the SOI substrate 100S. In this case, the movable section 101 is displaced in the thickness direction of the SOI substrate 100S. When a large external force is applied, the movable section 101 causes large displacement and contacts with the protruding section 115. This is because the distance between the protruding section 115 and the movable section 101 is smaller than the distance between the movable section 101 and the support substrate 112S. This means that the movable section 101 can avoid direct contact with the support substrate 112S. When the movable section 101 is displaced in the thickness direction of the SOI substrate 100S, the movable section 101 first contacts with the protruding section 115. The end of the protruding section 115 is small. Therefore, there may be a small contact area between the movable section 101 and the protruding section 115 when they contact with each other. The movable section 101 is hardly considered to stick to the protruding section 115 even when they contact with each other. The movable section 101 is considered to stick to another member when most part of the area of the movable section 101 contacts with the member. According to, the first embodiment, the movable section 101 contacts with the protruding section 115 having a small area and can be prevented from sticking. According to the first embodiment, the polysilicon film 114 bulges out of the protrusion formation hole 111 toward the movable section 101 to form the protruding section 115. The distance between the protruding section 115 and the movable section 101 is configured to be smaller than the distance between the support substrate 112S and the movable section 101. The protruding section 115 functions as a stopper that prevents the movable section 101 from sticking to the support substrate 112S. In this manner, the first embodiment can provide a remarkable effect of preventing the movable section 101 from sticking to the support substrate 112S.

Figure 3B:
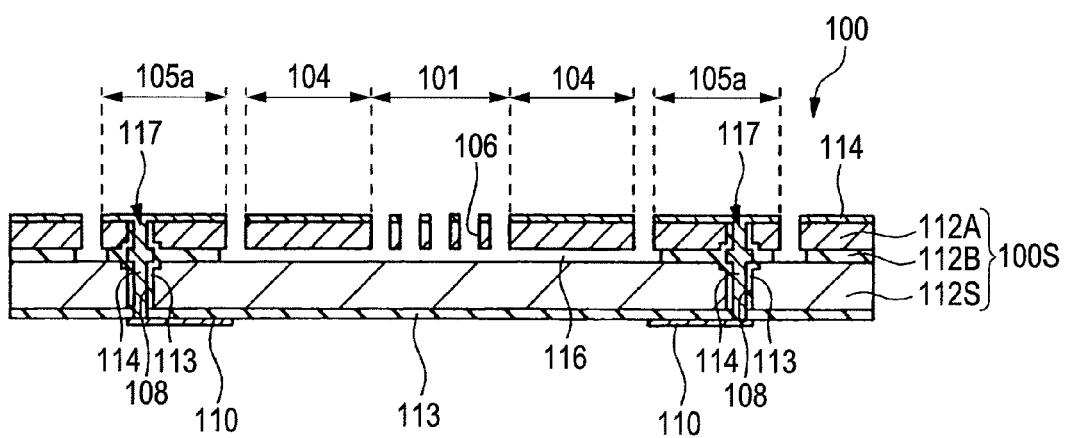
FIG. 3B is a cross sectional view taken along the line B-B of FIGS. 1 and 2.

FIG. 3B is a cross sectional view taken along the line B-B of FIGS. 1 and 2. As shown in FIG. 3B, processing the SOI substrate 100S forms the acceleration sensor 100 according to the first embodiment. The SOI substrate 100S includes the support substrate 112S, the intermediate insulation layer 112B formed on the support substrate 112S, and the active layer 112A formed on the intermediate insulation layer 112B. Specifically, the acceleration sensor 100 according to the first embodiment includes the polysilicon film 114 formed on the active layer (silicon layer) 112A. The active layer 112A and the polysilicon film 114 are integrally processed to form the movable section 101, the movable electrode 104, and the unmovable electrode 105a. The movable section 101 and the movable electrode 104 are formed integrally. The intermediate insulation layer 112B below the active layer 112A forming the movable section 101 and the movable electrode 104 is removed to form the gap 116. Multiple etching holes 106 are formed in the movable section 101 in order to effectively remove the intermediate insulation layer 112B formed below the movable section 101. On the other hand, the intermediate insulation layer 112B below the active layer 112A forming the unmovable electrode 105a remains. The unmovable section 105a is fixed to the support substrate 112S through the intermediate insulation layer 112B.

The through-hole 108 is formed in the unmovable electrode 105a so as to pierce the support substrate 112S, the intermediate insulation layer 112B, and the active layer 112A. The oxide silicon film 113 is formed on the rear surface of the support substrate 112S including an inner wall of the through-hole, 108. The polysilicon film 114 is formed so as to fill inside the through-hole 108 through the oxide silicon film 113. The through-hole 108 is embedded with the polysilicon film 114 to form the through-hole electrode 117. The unmovable electrode 105a including the active layer 112A and the polysilicon film 114 formed on the active layer 112A is connected to the through-hole electrode 118 piercing the active layer 112A, the intermediate insulation layer 112B, and the support substrate 112S. The through-hole electrode 117 is connected to the electrode 110 formed on the rear surface of the support substrate 112S. Accordingly, the unmovable electrode 105a is electrically connected to the electrode 110 formed on the rear surface of the support substrate 112S through the through-hole electrode 117.

The following describes operations of the acceleration sensor 100 having the above-mentioned configuration according to the first embodiment. Operations of the acceleration sensor 100 according to the first embodiment will be described with reference to FIG. 1. Let us suppose that acceleration is applied in the +y direction in FIG. 1. In this case, the unmovable section 103 is unchanged. The beam 102 elastically deforms in the +y direction. The movable electrode 104 is formed integrally with the movable section 101 and is accordingly displaced in the +y direction. The unmovable electrodes 105a and 105b are fixed and are not displaced. The unmovable electrode 105a is not displaced and the movable electrode 104 is displaced in the +y direction on the capacitative element C1 including the movable electrode 104 and the unmovable electrode 105a. As a result, the distance between the unmovable electrode 105a and the movable electrode 104 decreases. Decreasing the distance between the unmovable electrode 105a and the movable electrode 104 increases a capacitance value of the capacitative element C1. Therefore, the capacitance value of the capacitative element C1 changes increasingly.

On the other hand, the unmovable electrode 105b is not displaced and the movable electrode 104 is displaced in the +y direction on the capacitative element C2 including the movable electrode 104 and the unmovable electrode 105b. As a result, the distance between the unmovable electrode 105b and the movable electrode 104 increases. Increasing the distance between the unmovable electrode 105b and the movable electrode 104 decreases a capacitance value of the capacitative element C2. The capacitance value of the capacitative element C2 changes decreasingly. When acceleration is applied to the acceleration sensor 100 in the +y direction, the capacitative element C1 increasingly changes the capacitance value and the capacitative element C2 decreasingly changes the capacitance value. While the capacitative elements C1 and C2 are subject to changes in the capacitance, the first embodiment detects the capacitative element C1 that increases a capacitance value. Acceleration applied in the +y direction can be estimated from the fact that the capacitative element C1 increases a capacitance value, for example.

The movable electrode 104 is connected to the electrode 110 on the rear surface through the movable section 101, the beam 102, the unmovable section 103, and the through-hole electrode 117. The unmovable electrode 105$a$ is connected to another electrode 110 through another through-hole electrode 117. A change in the capacitance value of the capacitative element C1 is output to an external circuit through these electrodes 110. For example, the external circuit is provided with a capacitance-voltage conversion circuit. The capacitance-voltage conversion circuit converts the capacitance change output from the acceleration sensor 100 into a voltage signal. A signal processing section processes the voltage signal converted in the capacitance-voltage conversion circuit. The voltage signal is finally output as an acceleration signal to the outside. The acceleration sensor 100 according to this configuration can detect an acceleration signal. As mentioned above, an increase in the capacitance value of the capacitative element C1 can indicate that acceleration is applied in the +y direction. The acceleration magnitude can be detected because a change in the capacitance value of the capacitative element C1 is converted into a voltage signal.

Let us suppose that acceleration is applied in the −y direction in FIG. 1. In this case, the unmovable section 103 is unchanged. However, the beam 102 elastically deforms to displace the movable section 101 in the −y direction. The movable electrode 104 formed integrally with the movable section 101 is displaced in the −y direction. The unmovable electrodes 105$a$ and 105$b$ are fixed and therefore not displaced. The unmovable electrode 105$b$ is not displaced and the movable electrode 104 is displaced in the −y direction on the capacitative element C2 including the movable electrode 104 and the unmovable electrode 105$b$. As a result, the distance between the unmovable electrode 105$b$ and the movable electrode 104 decreases. Decreasing the distance between the unmovable electrode 105$b$ and the movable electrode 104 increases a capacitance value of the capacitative element C2. The capacitance value of the capacitative element C2 changes increasingly.

On the other hand, the unmovable electrode 105$a$ is not displaced and the movable electrode 104 is displaced in the −y direction on the capacitative element C1 including the movable electrode 104 and the unmovable electrode 105$a$. As a result, the distance between the unmovable electrode 105$a$ and the movable electrode 104 increases. Increasing the distance between the unmovable electrode 105$a$ and the movable electrode 104 decreases a capacitance value of the capacitative element C1. The capacitance value of the capacitative element C1 changes decreasingly. When acceleration is applied to the acceleration sensor 100 in the −y direction, the capacitative element C2 increasingly changes the capacitance value and the capacitative element C1 decreasingly changes the capacitance value. While the capacitative elements C1 and C2 are subject to changes in the capacitance, the first embodiment detects the capacitative element C2 that increases a capacitance value. Acceleration applied in the −y direction can be estimated from the fact that the capacitative element C2 increases a capacitance value, for example.

The movable electrode 104 is connected to the electrode 110 on the rear surface through the movable section 101, the beam 102, the unmovable section 103, and the through-hole electrode 117. The unmovable electrode 105$b$ is connected to another electrode 110 through another through-hole electrode 117. A change in the capacitance value of the capacitative element C2 is output to an external circuit through these electrodes 110. For example, the external circuit is provided with a capacitance-voltage conversion circuit. The capacitance-voltage conversion circuit converts the capacitance change output from the acceleration sensor 100 into a voltage signal. A signal processing section processes the voltage signal converted in the capacitance-voltage conversion circuit. The voltage signal is finally output as an acceleration signal to the outside. The acceleration sensor 100 according to this configuration can detect an acceleration signal. As mentioned above, an increase in the capacitance value of the capacitative element C2 can indicate that acceleration is applied in the −y direction. The acceleration magnitude can be detected because a change in the capacitance value of the capacitative element C2 is converted into a voltage signal. As seen from the above, the acceleration sensor 100 according to the first embodiment can detect the +y or −y direction and the magnitude of the acceleration.

For example, the acceleration sensor 100 according to the first embodiment is configured to be able to detect acceleration applied in the y direction of FIG. 1. Depending on cases, an external force may be applied to the acceleration sensor 100 in the z direction of FIG. 1. In other words, an external force may be applied in the thickness direction of the SOI substrate 100S in FIGS. 3A and 3B. As shown in FIG. 3A, for example, the gap 116 is formed between the movable section 101 and the support substrate 112S. The movable section 101 is considered to be displaced in the thickness direction of the SOI substrate 100S. As shown in FIG. 3A, the first embodiment forms the protruding section 115 between the movable section 101 and the support substrate 112S. According to the first embodiment, the distance between the protruding section 115 and the movable section 101 is smaller than the distance between the movable section 101 and the support substrate 112S. Even when a large external force increases the displacement for the movable section 101, the movable section 101 first contacts with the protruding section 115. When the movable section 101 is displaced in the thickness direction of the SOI substrate 100S, the movable section 101 first contacts with the protruding section 115. The end of the protruding section 115 is small. Therefore, there may be a small contact area between the movable section 101 and the protruding section 115 when they contact with each other. The movable section 101 is hardly considered to stick to the protruding section 115 even when they contact with each other. The movable section 101 is considered to stick to another member when most part of the area of the movable section 101 contacts with the member. According to the first embodiment, the movable section 101 contacts with the protruding section 115 having a small area and can be prevented from sticking. According to the first embodiment, the polysilicon film 114 bulges out of the protrusion formation hole 111 toward the movable section 101 to form the protruding section 115. The distance between the protruding section 115 and the movable section 101 is configured to be smaller than the distance between the support substrate 112S and the movable section 101. It is possible to prevent sticking between the movable section 101 and the support substrate 112S. As a result, the first embodiment can solve the problem that the movable section 101 sticks to the support substrate 112S to interfere with displacement of the movable section 101 in the y direction when acceleration is applied in the y direction. The first embodiment can provide a remarkable effect of improving reliability of the acceleration sensor 100.

The following describes a manufacturing method of the acceleration sensor 100 according to the first embodiment. As mentioned above, the acceleration sensor 100 according to the first embodiment mainly includes the MEMS structure (including the movable section 101, the beam 102, and the unmovable section 103), the intermediate insulation layer formed below the active layer, and the support substrate (support layer) formed below the intermediate insulation layer. There are two methods of manufacturing these layers. The first manufacturing method is to form the intermediate insulation layer on the support substrate and deposit the polysilicon film thereon to form the active layer on the intermediate insulation layer. The second manufacturing method is to form the intermediate insulation layer on the support substrate, bond a silicon substrate thereto, and polish the bonded silicon substrate to form the active layer on the intermediate insulation layer.

Increasing a capacitance value detected from the capacitive element increases sensitivity of the capacitance acceleration sensor. Since a thicker active layer is more effective, it is preferable to use the second manufacturing method that can increase the active layer thickness. The second manufacturing method further includes two methods. One is to form a pattern including the MEMS structure on the silicon substrate and then bond the patterned silicon substrate to the support substrate where the intermediate insulation layer is formed. The other is to purchase an unpatterned SOI substrate and form the MEMS structure on this SOI substrate.

Compared to the latter, the former requires extra patterning operations and the use of a bonding apparatus. As a result, the manufacturing efficiency for acceleration sensors degrades and manufacturing costs increase. Accordingly, the method of purchasing an unpatterned SOI substrate and form a MEMS structure is preferable for manufacturing the acceleration sensor from the viewpoint of manufacturing efficiency improvement and cost reduction. While various manufacturing methods are available for the acceleration sensor 100 according to the first embodiment as mentioned above, the following describes the method of forming the MEMS structure from an unpatterned SOI substrate in terms of advantages of the manufacturing efficiency and costs.

As shown in FIGS. 1, 2, and 3B, the acceleration sensor 100 according to the first embodiment needs to form the through-hole electrode 117. The active layer 112A of the SOI substrate 100S is processed to form the MEMS structure. An electric access to the MEMS structure formed on the active layer 112A is made from the rear surface of the support substrate 112A. The acceleration sensor 100 according to the first embodiment needs to form the through-hole electrode 117. The first embodiment assumes formation of the through-hole electrode 117. A process of forming the through-hole electrode 117 is used to form the protruding section 115 in such a manner that the polysilicon film 114 bulges out of the protrusion formation hole 111 toward the movable section 101. The distance between the protruding section 115 and the movable section 101 is adjusted to be smaller than the distance between the support substrate 112S and the movable section 101. Such a manufacturing method will be described with reference to FIGS. 4 through 11. FIGS. 4A through 11A show manufacturing processes on a cross sectional view taken along the line A-A of FIGS. 1 and 2. FIGS. 4B through 11B show manufacturing processes on a cross sectional view taken along the line B-B of FIGS. 1 and 2.

Figure 4A:
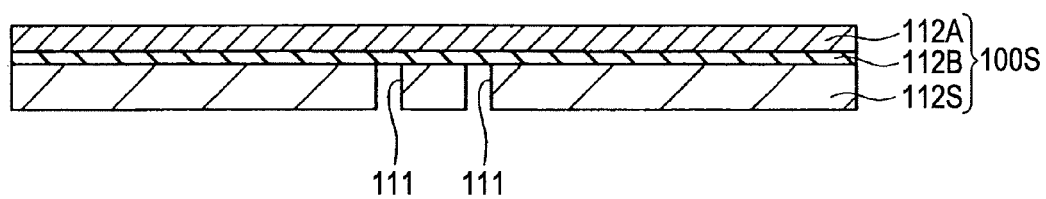
FIG. 4A is a cross sectional view taken along the line A-A of FIG. 1, illustrating a manufacturing process for the acceleration sensor according to the first embodiment.
Figure 4B:
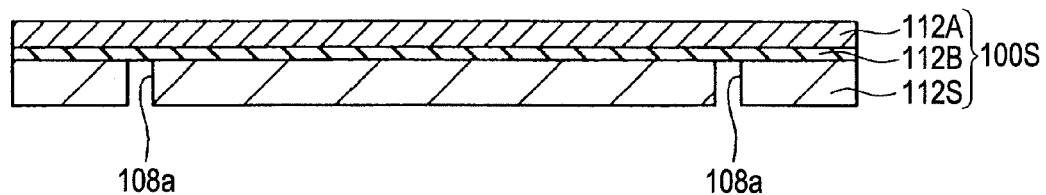
FIG. 4B is a cross sectional view taken along the line B-B of FIG. 1, illustrating a manufacturing process for the acceleration sensor according to the first embodiment.

FIGS. 4A and 4B show cross sectional views of the SOI substrate 100S to be used. The SOI substrate 100S includes the support substrate 112S, the intermediate insulation layer 112B formed on the support substrate 112S, and the active layer (silicon layer) 112A formed on the intermediate insulation layer 112B. An oxide silicon film (not shown) as a hard mask is formed on the rear surface (bottom surface in FIGS. 4A and 4B) of the support substrate 112S. A resist film (not shown) is applied to the oxide silicon film. The photolithography technology is used to pattern the resist film. The resist film is patterned to open a region for forming the protrusion formation hole 111 and a first hole 108a for through-hole electrode formation. The patterned resist film is used as a mask to etch the oxide silicon film. The patterned resist film and the oxide silicon film (hard mask) are used for dry etching to process the support substrate 112S and form the protrusion formation hole 111 as shown in FIG. 4A and the first hole 108a for through-hole electrode formation as shown in FIG. 4B. For example, the support substrate 112S is made of silicon. The intermediate insulation layer 112B is made of the oxide silicon film. The intermediate insulation layer 112B is used as an etching stopper layer for dry etching of the support substrate 112S (silicon). As shown in FIGS. 4A and 4B, the intermediate insulation layer 112B is exposed from the protrusion formation hole 111 and the first hole 108a for through-hole electrode formation formed in the support substrate 112S. An ashing process using oxygen plasma is applied to remove the patterned resist film. Hydrofluoric acid solution is used to remove the oxide silicon film as a hard mask. The first embodiment uses the oxide silicon film as a hard mask for forming the protrusion formation hole 111 and the first hole 108a for through-hole electrode formation. As an alternative, for example, a metal film such as an aluminum film may be used.

Figure 5A:
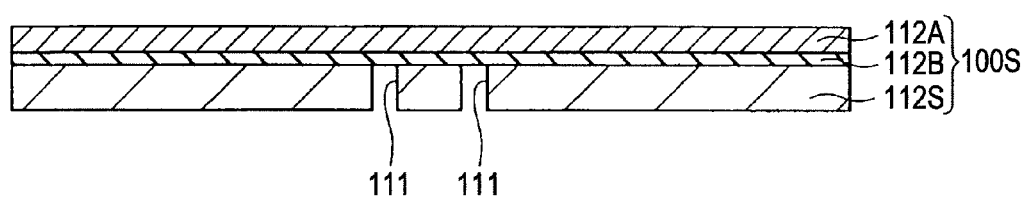
FIG. 5A is a cross sectional view illustrating the manufacturing process subsequent to FIG. 4A for the acceleration sensor.
Figure 5B:
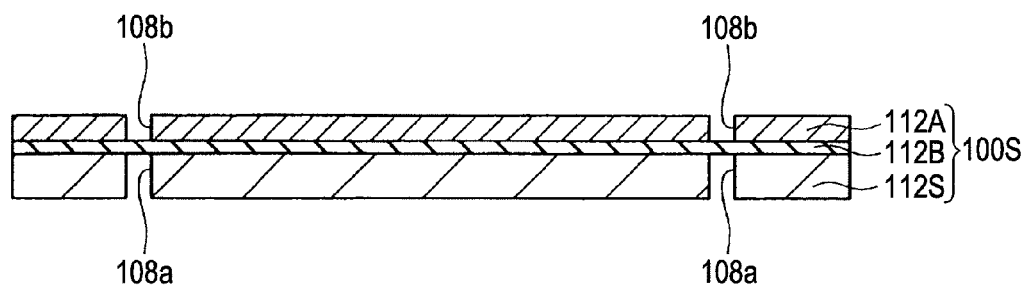
FIG. 5B is a cross sectional view illustrating the manufacturing process subsequent to FIG. 4B for the acceleration sensor.

As shown in FIGS. 5A and 5B, an oxide silicon film (not shown) is formed on the active layer 112A opposite the support substrate 112S. A resist film (not shown) is applied onto the oxide silicon film. The photolithography technology is used to pattern the resist film. The resist film is patterned to open only a region for forming the through-hole electrode. The patterned resist film is used as a mask to etch the oxide silicon film. The patterned resist film and the oxide silicon film (hard mask) are used as masks for dry etching to process the active layer 112A and form a second hole 108b for through-hole electrode formation. For example, the active layer 112A is made of silicon. The intermediate insulation layer 112B is made of an oxide silicon film. The intermediate insulation layer 112B is used as an etching stopper layer during dry etching for the active layer 112A (silicon). As shown in FIG. 5B, the intermediate insulation layer 112B is exposed from the bottom of the second hole 108b for through-hole electrode formation. An ashing process using oxygen plasma is applied to remove the patterned resist film. Hydrofluoric acid solution is used to remove the oxide silicon film as a hard mask.

Figure 6A:
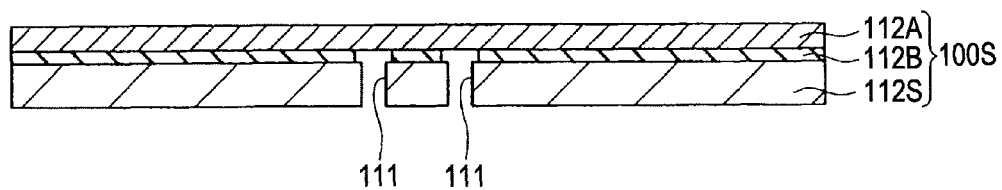
FIG. 6A is a cross sectional view illustrating the manufacturing process subsequent to FIG. 5A for the acceleration sensor.
Figure 6B:
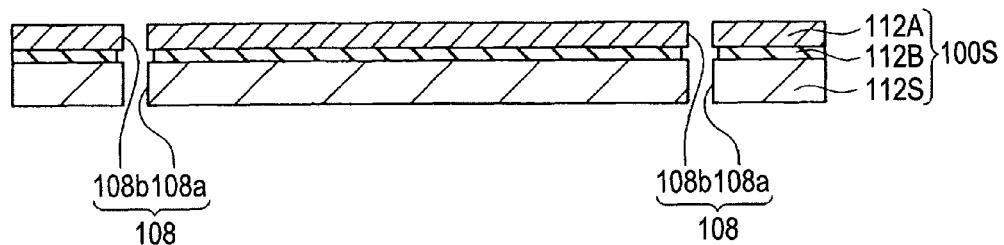
FIG. 6B is a cross sectional view illustrating the manufacturing process subsequent to FIG. 5B for the acceleration sensor.

As shown in FIGS. 6A and 6B, part of the intermediate insulation layer 112B is exposed from the protrusion formation hole 111. Parts of the intermediate insulation layer 112B are exposed from the first hole 108a for through-hole electrode formation and from the second hole 108b for through-hole electrode formation. The exposed parts of the intermediate insulation layer 112B are removed. Since the intermediate insulation layer 112B is made of an oxide silicon film, hydrofluoric acid solution can be used to remove the exposed parts of the intermediate insulation layer 112B. As shown in FIG. 6A, the intermediate insulation layer 112B is removed from the protrusion formation hole 111 to expose the active layer 112A. As shown in FIG. 6B, the first hole 108B for through-hole electrode formation links with the second hole 108b for through-hole electrode formation to form the through-hole 108 that pierces the SOI substrate 100S.

Figure 7A:
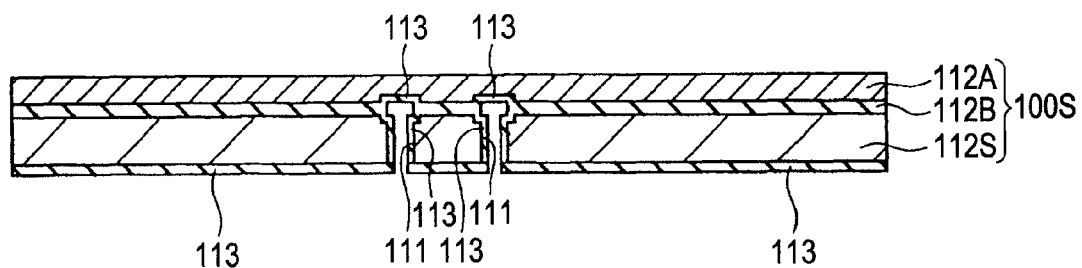
FIG. 7A is a cross sectional view illustrating the manufacturing process subsequent to FIG. 6A for the acceleration sensor.
Figure 7B:
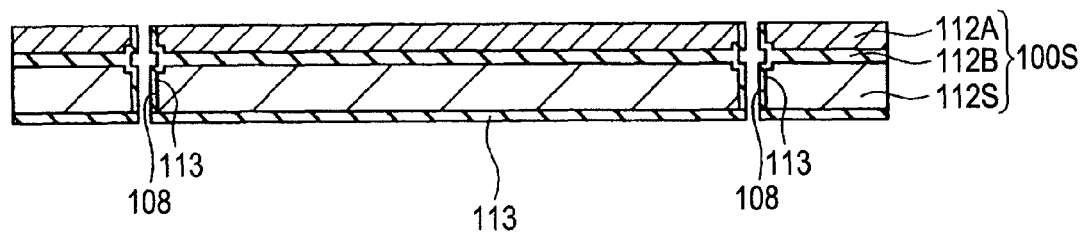
FIG. 7B is a cross sectional view illustrating the manufacturing process subsequent to FIG. 6B for the acceleration sensor.

As shown in FIGS. 7A and 7B, the SOI substrate 100S is thermally oxidized in the presence of oxygen at 1000° C. or higher. As a result, the oxide silicon film 113 is formed on the rear surface of the support substrate 112S, the surface of the active layer 112A, the inner wall of the through-hole 108, the inner wall of the protrusion formation hole 111, and the surface of the active layer 112A exposed from the protrusion formation hole 111. For example, a CMP (Chemical Mechanical Polishing) technique is used to remove the oxide silicon film 113 formed on the active layer 112A. Instead of the CMP technique, etching may be used to remove the oxide silicon film 113 formed on the active layer 112A.

Figure 8A:
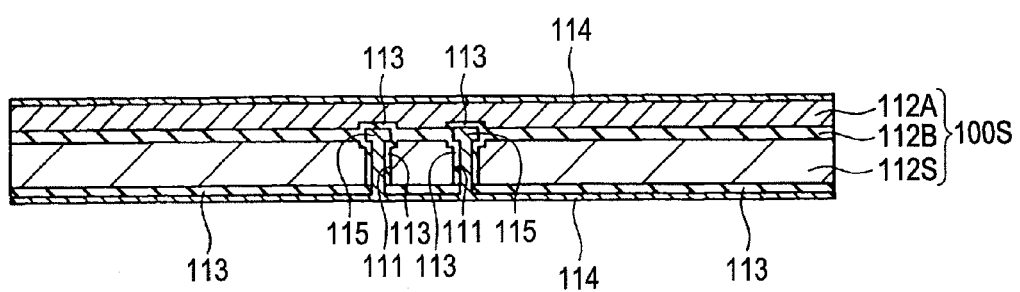
FIG. 8A is a cross sectional view illustrating the manufacturing process subsequent to FIG. 7A for the acceleration sensor.
Figure 8B:
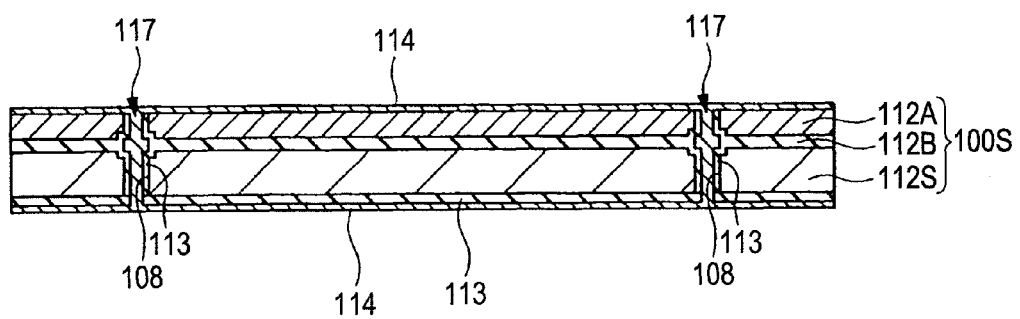
FIG. 8B is a cross sectional view illustrating the manufacturing process subsequent to FIG. 7B for the acceleration sensor.

As shown in FIGS. 8A and 8B, the polysilicon film 114 containing conductive impurities is formed as a conductive film on both surfaces of the SOI substrate. As a result, the polysilicon film 114 is formed on the top surface of the active layer 112A and the rear surface of the support substrate 112S. As shown in FIG. 8A, the protrusion formation hole 111 is fully filled with the polysilicon film 114. As shown in FIG. 8B, the through-hole 108 is also filled with polysilicon film 114. In this manner, the through-hole electrode 117 is formed so as to include the through-hole filled with the polysilicon film 114. The first embodiment uses the polysilicon film 114 as a conductive material for filling the protrusion formation hole 111 and the through-hole 108. As an alternative, for example, a plating technique may be used to fill the holes with a metal film.

Figure 9A:
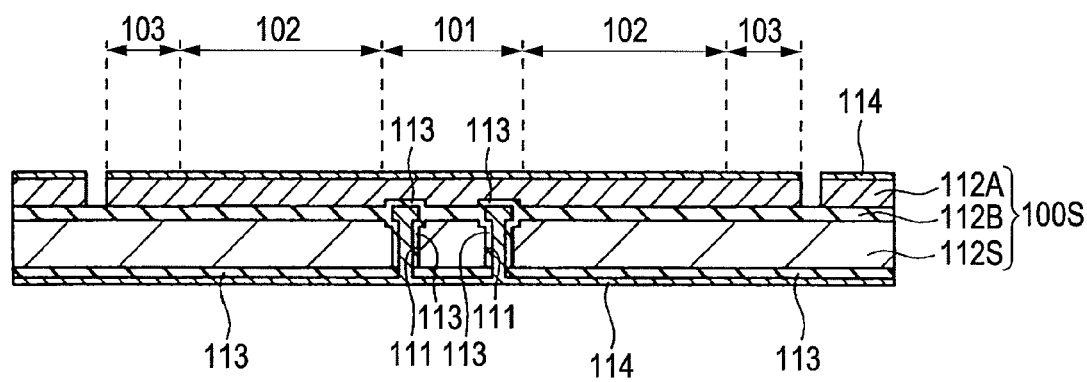
FIG. 9A is a cross sectional view illustrating the manufacturing process subsequent to FIG. 8A for the acceleration sensor.
Figure 9B:
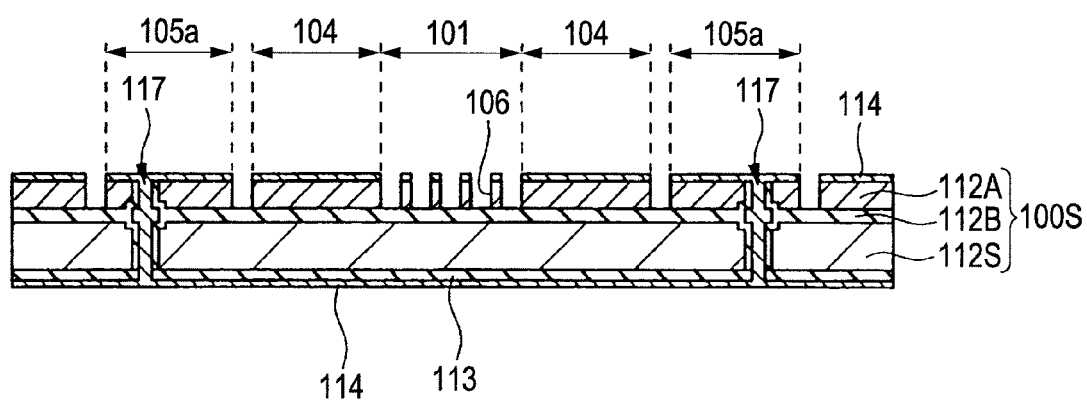
FIG. 9B is a cross sectional view illustrating the manufacturing process subsequent to FIG. 8B for the acceleration sensor.

The active layer 112A is then processed to form a MEMS structure. As shown in FIGS. 9A and 9B, an oxide silicon film (not shown) is formed on the active layer 112A. A resist film (not shown) is applied to the oxide silicon film. The photolithography technology is used to pattern the resist film. The resist film is patterned so as to form the MEMS structure on the active layer 112A (including the polysilicon film 114). The patterned resist film is used as a mask to etch the oxide silicon film. The oxide silicon film is used as a hard mask to etch the active layer 112A and form the MEMS structure on the active layer 112A. Specifically, FIG. 9A shows that the movable section 101, the beam 102, and the unmovable section 103 are formed as MEMS structures. FIG. 9B shows that the movable section 101 including the etching holes 106, the movable electrode 104, and the unmovable electrode 105a are formed. The process then removes the patterned resist film and the oxide silicon film as the hard mask.

Figure 10A:
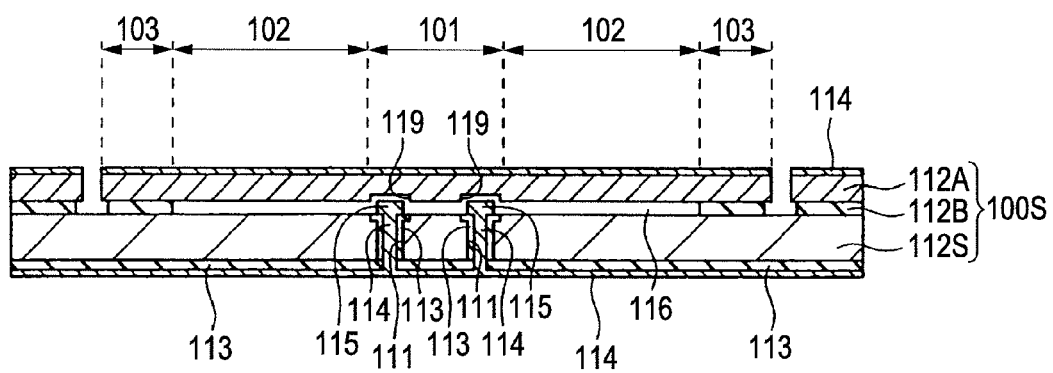
FIG. 10A is a cross sectional view illustrating the manufacturing process subsequent to FIG. 9A for the acceleration sensor.
Figure 10B:
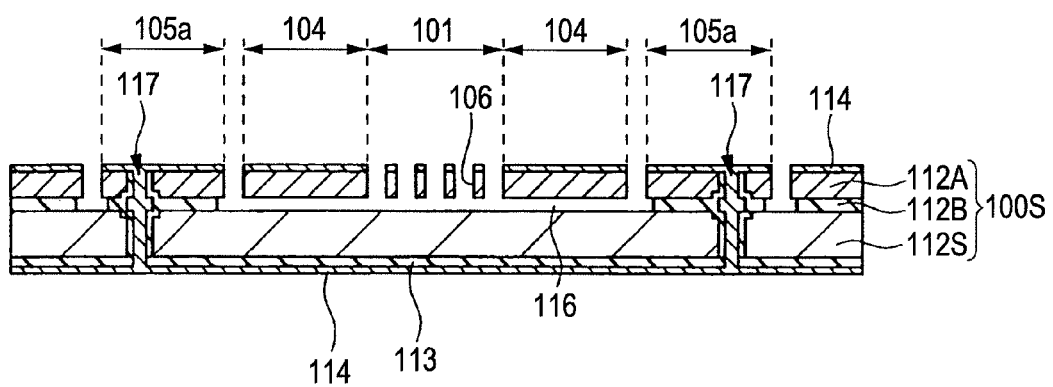
FIG. 10B is a cross sectional view illustrating the manufacturing process subsequent to FIG. 9B for the acceleration sensor.

As shown in FIGS. 10A and 10B, wet etching using hydrofluoric acid solution or vapor-phase etching is applied to remove the intermediate insulation layer 112B below the MEMS structures formed on the active layer 112A. As shown in FIG. 10A, the intermediate insulation layer 112B formed below the movable section 101 and the beam 102 as the MEMS structures is removed to form the gap 116. The movable section 101 can be displaced. The beam 102 becomes elastically deformable. On the other hand, the intermediate insulation layer 112B below the unmovable section 103 is adjusted not to be removed. Since the unmovable section 103 has a large area, the intermediate insulation layer 112B below the unmovable section 103 is side-etched but largely remains unremoved. The intermediate insulation layer 112B remains below the unmovable section 103. The unmovable section 103 is fixed to the support substrate 112S through the intermediate insulation layer 112B.

As shown in FIG. 10A, the intermediate insulation layer 112B formed below the movable section 101 is removed. The intermediate insulation layer 112B around the protrusion formation hole 111 formed blow the movable section 101 is also removed. As a result, as shown in FIG. 10A, the polysilicon film 114 embedded in the protrusion formation hole 111 partially bulges out toward the movable section 101 to form the protruding section 115. The oxide silicon film 113 formed on the protruding section 115 is removed to form the recessed section 119 between the protruding section 115 and the movable section 101. The distance between the protruding section 115 and the movable section 101 becomes smaller than the distance between the support substrate 112S and the movable section 101. The first embodiment forms the oxide silicon film 113 at the bottom of the protrusion formation hole 111 (on the rear surface of the movable section 101) so as to be thinner than the intermediate insulation layer 112B. As a result, the distance between the protruding section 115 and the movable section 101 can be smaller than the distance between the support substrate 112S and the movable section 101.

As seen from FIG. 10B, the intermediate insulation layer 112B formed below the movable section 101 and the movable electrode 104 is removed. Multiple etching holes 106 are formed in the movable section 101. Providing the movable section 101 with the etching holes 106 can efficiently remove the intermediate insulation layer 112B formed below the movable section 101. On the other hand, the intermediate insulation layer 112B formed below the unmovable electrode 105a remains unremoved. Consequently, the unmovable electrode 105a is fixed to the support substrate 112S through the intermediate insulation layer 112B.

Figure 11A:
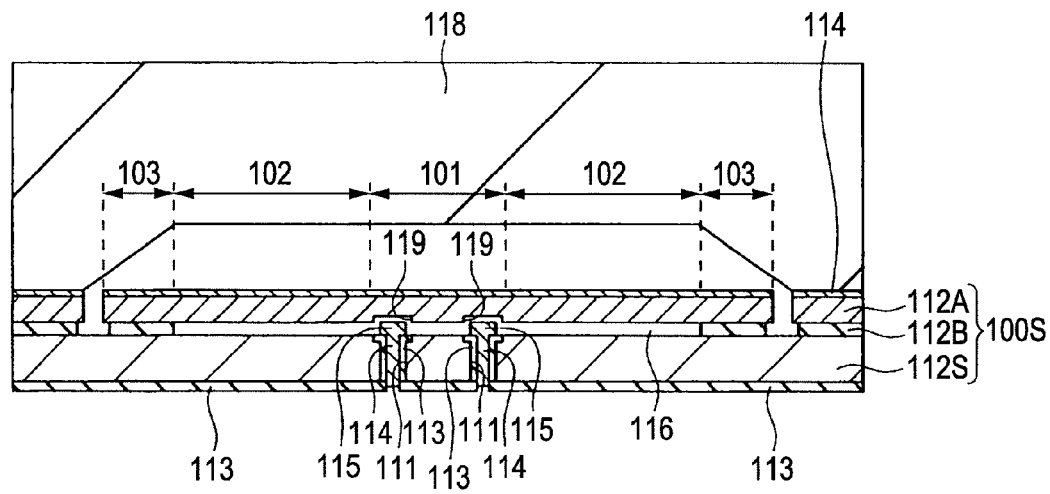
FIG. 11A is a cross sectional view illustrating the manufacturing process subsequent to FIG. 10A for the acceleration sensor.
Figure 11B:
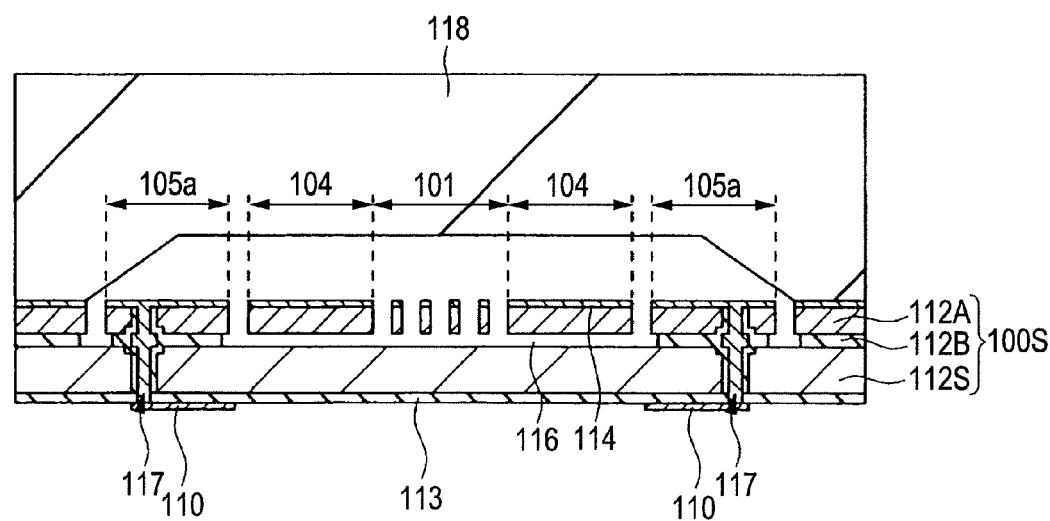
FIG. 11B is a cross sectional view illustrating the manufacturing process subsequent to FIG. 10B for the acceleration sensor.

As shown in FIGS. 11A and 11B, the SOI substrate 100S is bonded to another substrate 118 made of glass, for example. As shown in FIGS. 11A and 11B, the substrate 118 is provided with a cavity. The substrate (glass cap substrate) 118 is bonded to the SOI substrate 100S so that the cavity horizontally overlaps with the MEMS structures (including the movable section 101, the beam 102, and the unmovable section 103) formed on the SOI substrate 100S. As a result, the MEMS structures are sealed. The purpose is to stabilize a pressure around the MEMS structures and prevent foreign substances from entering the MEMS structures. The electrode 110 is formed on the rear surface of the SOI substrate 100S (rear surface of the support substrate 112S). According to the first embodiment, the glass cap substrate is bonded to the SOI substrate 100S and then the electrode is formed on the rear surface of the SOI substrate 100S. As an alternative, for example, the electrode 110 may be formed on the rear surface of the SOI substrate 100S and then the SOI substrate 100S may be bonded to the glass cap substrate 118. This technique can also manufacture the MEMS device (acceleration sensor) according to the first embodiment.

As mentioned above, the MEMS device manufacturing method according to the first embodiment can form the stopper (protruding section 115) characteristic to the first embodiment using part of processes for forming the through-hole electrode 117 on the SOI substrate 100S. The method can form the through-hole electrode 117 and the stopper (protruding section 115) without using an additional process for forming the stopper. The first embodiment can provide the highly reliable, hardly sticking MEMS device without increasing manufacturing processes and costs.

Figure 12:
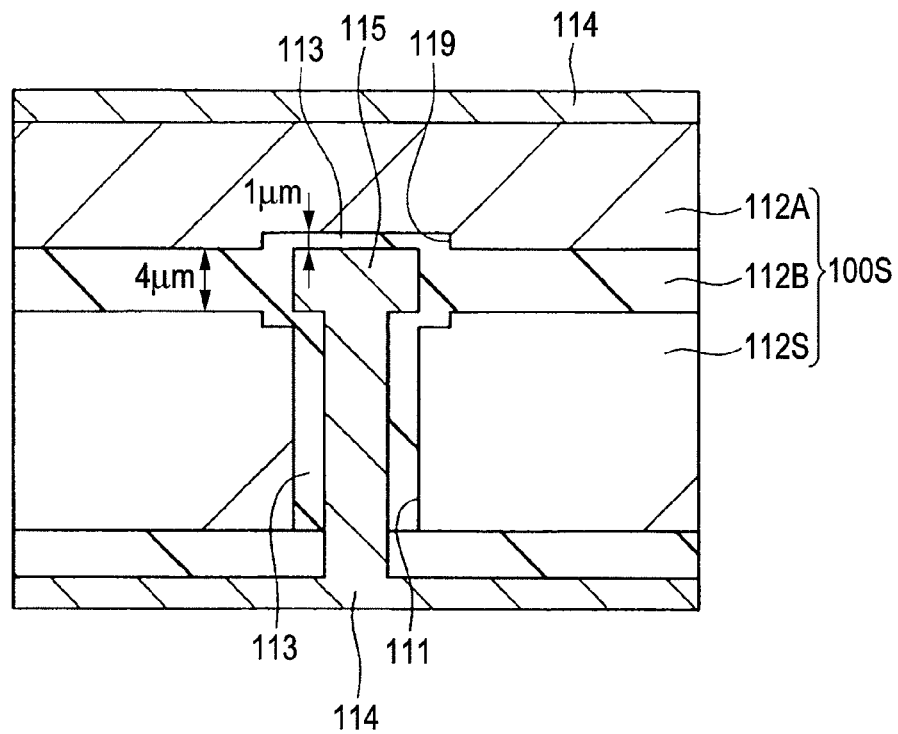
FIG. 12 is an enlarged sectional view showing a structure near a protruding section in the manufacturing process shown in FIG. 8A.

The following describes effects of the first embodiment with reference to the appended drawings. FIG. 12 is an enlarged sectional view showing a structure near the protruding section 115 in the manufacturing process shown in FIG. 8A. As shown in FIG. 12, the polysilicon film 114 is formed on both sides of the SOI substrate 100S including the support substrate 112S, the intermediate insulation layer 112B, and the active layer 112A. The protrusion formation hole 111 is formed so as to reach the active layer 112A through the support substrate 112S and the intermediate insulation layer 112B. The oxide silicon film 113 is formed on an inner wall of the protrusion formation hole 111. The protrusion formation hole 111 is embedded with the polysilicon film 114 together with the oxide silicon film 113. The intermediate insulation layer 112B embedded in the protrusion formation hole 111 is partially surrounded by the intermediate insulation layer 112B and forms the protruding section 115. The oxide silicon film 113 is formed above the protruding section 115 so as to erode the active layer 112A. The recessed section 119 is formed above the protruding section 115 so as to erode the active layer 112A. The oxide silicon film 113 is formed in the recessed section 119. According to the first embodiment, for example, the intermediate insulation layer 112B is four micrometers thick. The oxide silicon film 113 one micrometer thick is formed between the protruding section 115 and the recessed section 119 in the active layer 112A.

Figure 13:
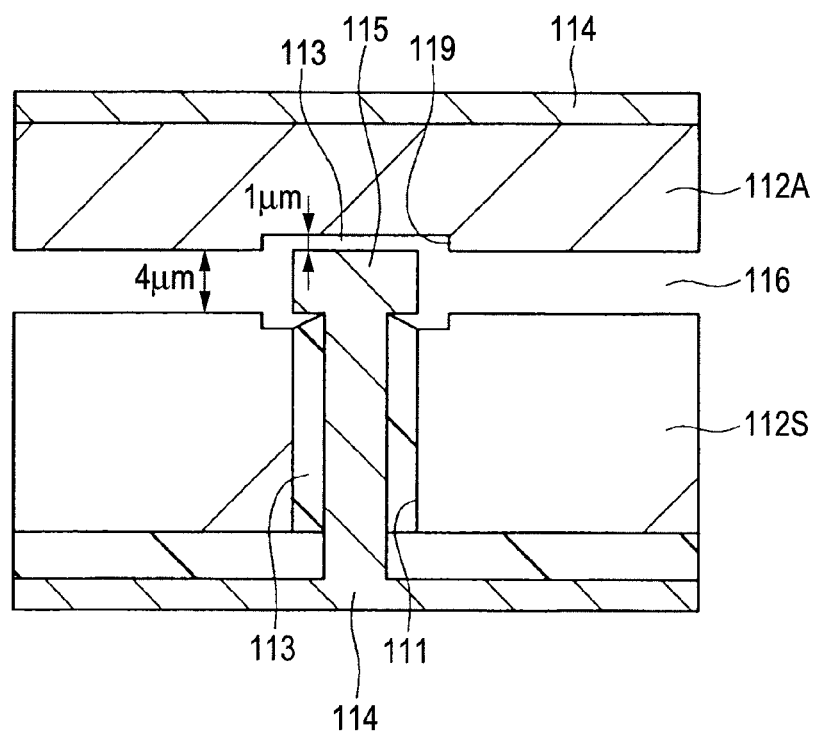
FIG. 13 is an enlarged sectional view showing a structure near the protruding section in the manufacturing process shown in FIG. 10A.

FIG. 13 shows that the intermediate insulation layer 112B is removed from the state in FIG. 12. FIG. 13 is an enlarged sectional view showing a structure near the protruding section 115 in the manufacturing process shown in FIG. 10A. As shown in FIG. 13, the intermediate insulation layer 112B is removed to form the gap 116 between the support substrate 112S and the active layer 112A. The gap 116 is approximately four micrometers thick. Removing the intermediate insulation layer 112B partially exposes the polysilicon film 114 embedded in the protrusion formation hole 111 to form the protruding section 115. The same material is used for the intermediate insulation layer 112B and the oxide silicon film 113 formed above the protruding section 115. Removing the intermediate insulation layer 112B also removes the oxide silicon film 113 formed above the protruding section 115. As a result, the recessed section 119 provides a space between the protruding section 115 and the active layer 112A. The space ensures a distance of approximately one micrometer.

When the active layer 112A as a movable section is displaced downward, the active layer 112A first contacts with the protruding section 115. The protruding section 115 restrains further displacement. The entire active layer 112A as a movable section can be prevented from sticking to the support substrate 112S. According to the first embodiment, only the protruding section 115 having a small area contacts with the active layer 112A as a movable section. It is possible to prevent the entire active layer 112A from sticking to the support substrate 112S.

The important point is that the space (recessed section 119) formed above the protruding section 115 is shorter than the gap 116 formed by removing the intermediate insulation layer 112B. According to this configuration, the active layer 112A as a movable section, when displaced downward, contacts with the protruding section 115 close to the active layer 112A. The active layer 112A can be prevented from sticking to the support substrate 112S. It is important for the first embodiment to adjust the thickness of the oxide silicon film 113 formed above the protruding section 115. To solve this problem, the first embodiment uses thermal oxidation to form the oxide silicon film 113 above the protruding section 115. This is because the thermal oxidation can form the oxide silicon film 113 so as to erode the active layer 112A made of silicon and ensure the uniform thickness of the oxide silicon film 113. The first embodiment uses the thermal oxidation to form the oxide silicon film 113 between the protruding section 115 and the active layer 112A so as to be able to easily adjust the thickness of the oxide silicon film 113. The thermal oxidation forms the oxide silicon film 113 having the uniform thickness between the protruding section 115 and the active layer 112A. The subsequent process of etching the intermediate insulation layer 112B removes the oxide silicon film 113 formed on the protruding section 115. This can easily control the distance between the protruding section 115 and the active layer 112A so as to conform to a design value.

As an alternative, for example, the etching amount for the intermediate insulation layer 112B may be adjusted to partially leave the intermediate insulation layer 112B immediately below the active layer 112A as a movable section. The remaining intermediate insulation layer 112B may be used as a protruding section. In this case, however, controlling the etching amount for the intermediate insulation layer 112B determines the distance between the protruding section and the active layer 112A. This technique adjusts the distance between the protruding section and the active layer 112A based on the etching amount that is controlled with difficulty. It is difficult to ensure the protruding section height and the distance between the protruding section and the active layer 112A so as to satisfy design values.

The first embodiment forms the oxide silicon film 113 between the protruding section 115 and the active layer 112A using the thermal oxidation that can easily control the film thickness. The oxide silicon film 113 formed by the thermal oxidation is then removed. The first embodiment can therefore easily and highly accurately form a gap between the protruding section 115 and the active layer 112A.

The first embodiment has described the acceleration sensor as an example of the MEMS device. The technical concept of the invention is not limited to the acceleration sensor but is broadly applicable to the MEMS device provided with the MEMS structures including the movable section 101, the beam 102, and the unmovable section 103. The following describes that the technical concept of the invention is applicable to an angular rate sensor (gyro) as an example other than the acceleration sensor.

Figure 14:
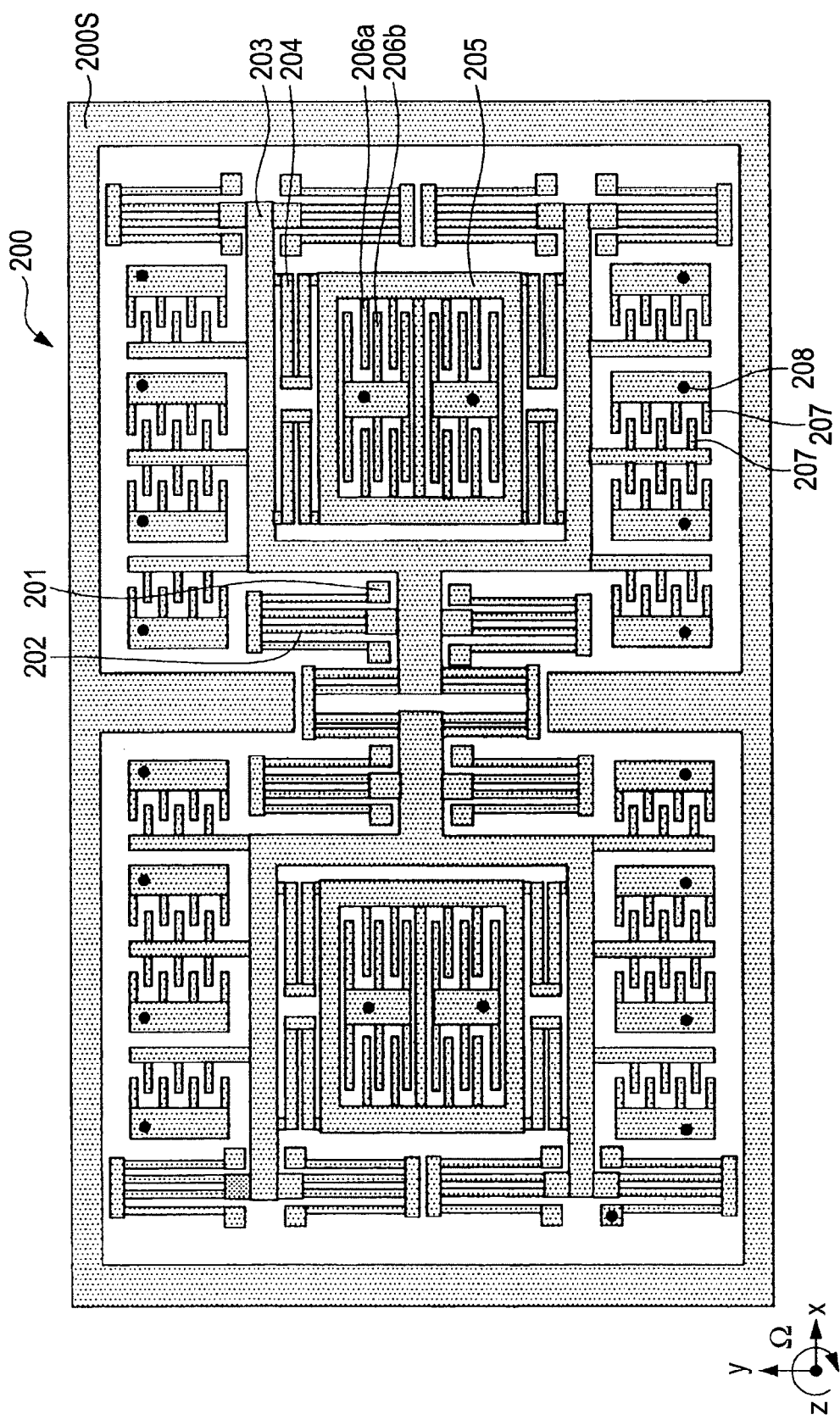
FIG. 14 is a top view showing a configuration of an angular rate sensor according to the first embodiment.

FIG. 14 is a top view showing a configuration of an angular rate sensor 200 according to the first embodiment. As shown in FIG. 14, the angular rate sensor 200 according to the first embodiment is formed on the SOI substrate 200S. The SOI substrate 200S includes a support substrate, an intermediate insulation layer formed on the support substrate, and an active layer (silicon layer) formed on the intermediate insulation layer. FIG. 14 shows a processed shape on the side of the active layer (silicon layer).

As shown in FIG. 14, the angular rate sensor 200 according to the first embodiment includes an unmovable section 201, a support beam 202, a movable section 203, a detection beam 204, a Coriolis element 205, a detection electrode 206a, an unmovable electrode 206b, a drive electrode 207, and a through-hole electrode 208. The support beam is configured to be elastically deformable. One end of the support beam 202 is connected to the movable section 203 and the other end thereof is connected to the unmovable section 201. The movable section 203 is configured to be displaced in the x direction. Specifically, the drive electrode 207 is formed integrally with the movable section 203. An electrostatic attractive force applied to the drive electrode 207 allows the movable section 203 to be capable of normal vibration in the x direction. The Coriolis element 205 is formed inside the movable section 203 through the detection beam 204. The Coriolis element 205 can be displaced in the y direction. The detection electrode 206a is formed integrally with the Coriolis element 205. The unmovable electrode 206b is formed so as to face the detection electrode 206a.

The following describes operations of the above-mentioned angular rate sensor 200 according to the first embodiment with reference to FIG. 14. Applying a voltage to the drive electrode 207 generates an electrostatic attractive force. The electrostatic attractive force allows the movable section 203 formed integrally with the drive electrode 207 to normally vibrate in the x direction. In other words, the movable section 203 is connected to the unmovable section 201 through the support beam 202. Applying a voltage to the drive electrode 207 normally vibrates the movable section 203 in the x direction. In this state, applying an angular rate around the z direction generates a Coriolis force in the y direction. The normally vibrating movable section 203 connects with the Coriolis element 205 through the detection beam 204. The Coriolis element 205 can be displaced in the y direction. The Coriolis force generated in the y direction displaces the Coriolis element 205 in the y direction. This changes the distance between the detection electrode 206a formed integrally with the Coriolis element 205 and the unmovable electrode 206b. That is, a change is made to a capacitance value of the capacitive element including the detection electrode 206a and the unmovable electrode 206b. Detecting a change in the capacitance of the capacitive element finds the magnitude of Coriolis force. As a result, it is possible to detect the angular rate as the source of generating the Coriolis force.

In the angular rate sensor 200 according to the first embodiment, the movable section 203 can be displaced in the x direction and the Coriolis element 205 can be displaced in the y direction. The active layer of the SOI substrate 200S is processed to form the movable section 203 and the Coriolis element 205. The process removes the intermediate insulation layer formed immediately below the movable section 203 and the Coriolis element 205. The movable section 203 and the Coriolis element 205 of the angular rate sensor 200 are configured similarly to the movable section 101 of the acceleration sensor 100 shown in FIG. 3.

For example, an external force may be also applied to the angular rate sensor 200 in the z direction of FIG. 14. In other words, an external force may be applied in the thickness direction of the SOI substrate 200S. In this case, a gap is formed between the movable section (or the Coriolis element) and the support substrate. The movable section is considered to be displaced in the thickness direction of the SOI substrate. The angular rate sensor 200 according to the first embodiment is also effectively configured to form a protruding section between the movable section and the support substrate. In the angular rate sensor 200 according to the first embodiment, the distance between the protruding section and the movable section is smaller than the distance between the movable section and the support substrate. Even when a large external force increases the displacement for the movable section, the movable section first contacts with the protruding section. When the movable section is displaced in the thickness direction of the SOI substrate 200S, the movable section first contacts with the protruding section. The end of the protruding section is small. Therefore, there may be a small contact area between the movable section and the protruding section when they contact with each other. The movable section is hardly considered to stick to the protruding section even when they contact with each other. The movable section is considered to stick to another member when most part of the area of the movable section contacts with the member. As with the angular rate sensor 200 according to the first embodiment, the movable section contacts with the protruding section having a small area and can be prevented from sticking. Also in the angular rate sensor 200 according to the first embodiment, the polysilicon film bulges out of the protrusion formation hole toward the movable section to form the protruding section. The distance between the protruding section and the movable section is configured to be smaller than the distance between the support substrate and the movable section. It is possible to prevent sticking between the movable section and the support substrate. As a result, the first embodiment can also provide a remarkable effect of improving reliability of the angular rate sensor 200.

The manufacturing method for the angular rate sensor 200 according to the first embodiment is almost the same as that for the acceleration sensor 100 according to the first embodiment. More specifically, the manufacturing method for the angular rate sensor 200 is the same as that for the acceleration sensor 100 except that the patterning for the active layer 112A in FIG. 9 is changed to form the unmovable section 201, the support beam 202, the movable section 203, the detection beam 204, the Coriolis element 205, the detection electrode 206a, the unmovable electrode 206b, and the drive electrode 207 shown in FIG. 14.

Second Embodiment

While the first embodiment has described the acceleration sensor 100 capable of detecting acceleration in the y direction, the second embodiment will describe an example of applying the technical concept of the invention to an acceleration sensor capable of detecting acceleration in the z direction.

Figure 15:
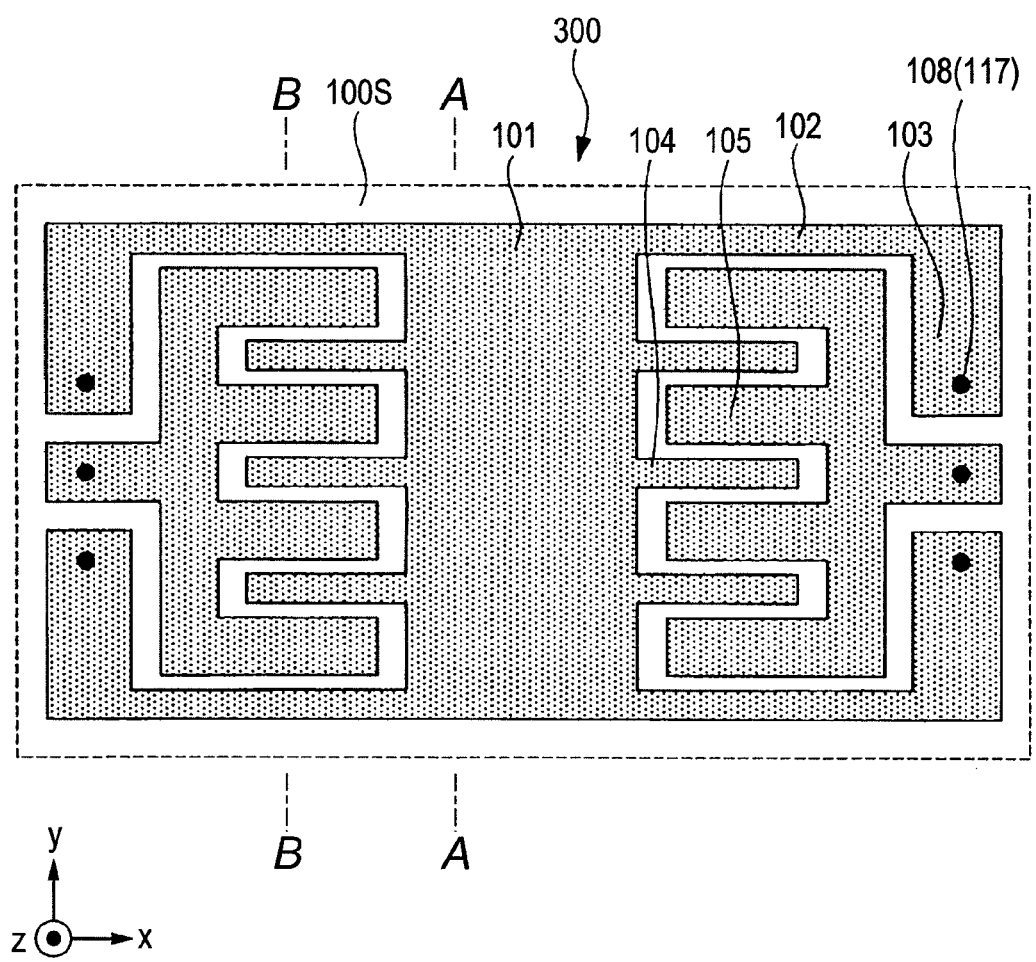
FIG. 15 is a top view showing a configuration of an acceleration sensor according to a second embodiment.

FIG. 15 is a top view showing a configuration of an acceleration sensor 300 according to the second embodiment. As shown in FIG. 15, the acceleration sensor 300 according to the second embodiment is formed on the SOI substrate 100S. The SOI substrate 100S includes a support substrate, an intermediate insulation layer formed on the support substrate, and an active layer (silicon layer) formed on the intermediate insulation layer. FIG. 15 shows a processed shape on the side of the active layer (silicon layer).

As shown in FIG. 15, the acceleration sensor 300 according to the second embodiment includes the movable section 101, the beam (elastic deformation section) 102, and the unmovable section 103. The movable section 101 is connected to the unmovable section 103 through the beam 102. The movable section 101 can be displaced in accordance with acceleration acting on the acceleration sensor 300. Specifically, the beam 102 is configured to be elastically deformable. The movable section 101 is connected to one end of the beam 102. The unmovable section 103 is connected to the other end of the beam 102. For example, applying acceleration in the z direction elastically deforms the beam 102. The movable section 101 connected to the elastically deforming beam 102 is displaced in the z direction. Applying acceleration in the z direction to the acceleration sensor 300 according to the second embodiment elastically deforms the beam 102 to displace the movable section 101 in the z direction while the movable section 101 is connected to one end of the beam 102. When acceleration is applied in the z direction to the acceleration sensor 300 according to the second embodiment, the movable section 101 is displaced in the z direction in accordance with the magnitude and the direction of the acceleration.

Processing the active layer of the SOI substrate 100S forms the movable section 101. The intermediate insulation layer formed below the active layer included in the movable section 101 is removed so that the movable section 101 can be displaced. As shown in FIG. 15, the movable section 101 is not provided with an etching hole. For example, the movable section 101 may be provided with an etching hole so as to easily remove the intermediate insulation layer below the movable section 101.

The movable electrode 104 is formed so as to be integrated with the movable section 101. The unmovable electrode 105 is formed so as to face the movable electrode 104. As shown in FIG. 15, for example, three movable electrodes 104 protrude from the right side of the movable section 101. Another three movable electrodes 104 protrude from the left side of the movable section 101. The comblike unmovable electrode 105 is formed so as to face the three movable electrodes 104 protruding from the right side of the movable section 101. The movable electrode 104 and the unmovable electrode 105 form a capacitative element In the acceleration sensor 300 according to the second embodiment, the movable section 101 is connected to the unmovable section 103 through the beam 102. The movable section 101, the beam 102, and the unmovable section 103 are made of conductive active layers (silicon layers). The movable section 101, the beam 102, and the unmovable section 103 are therefore connected mechanically and electrically. The through-hole 108 is formed in the unmovable section 103 and is filled with an electrical conducting material to form the through-hole electrode 117. The through-hole is also formed in the unmovable electrodes 105a and 105b and the dummy pattern 109 and is filled with an electrical conducting material to form the through-hole electrode 117.

Figure 16:
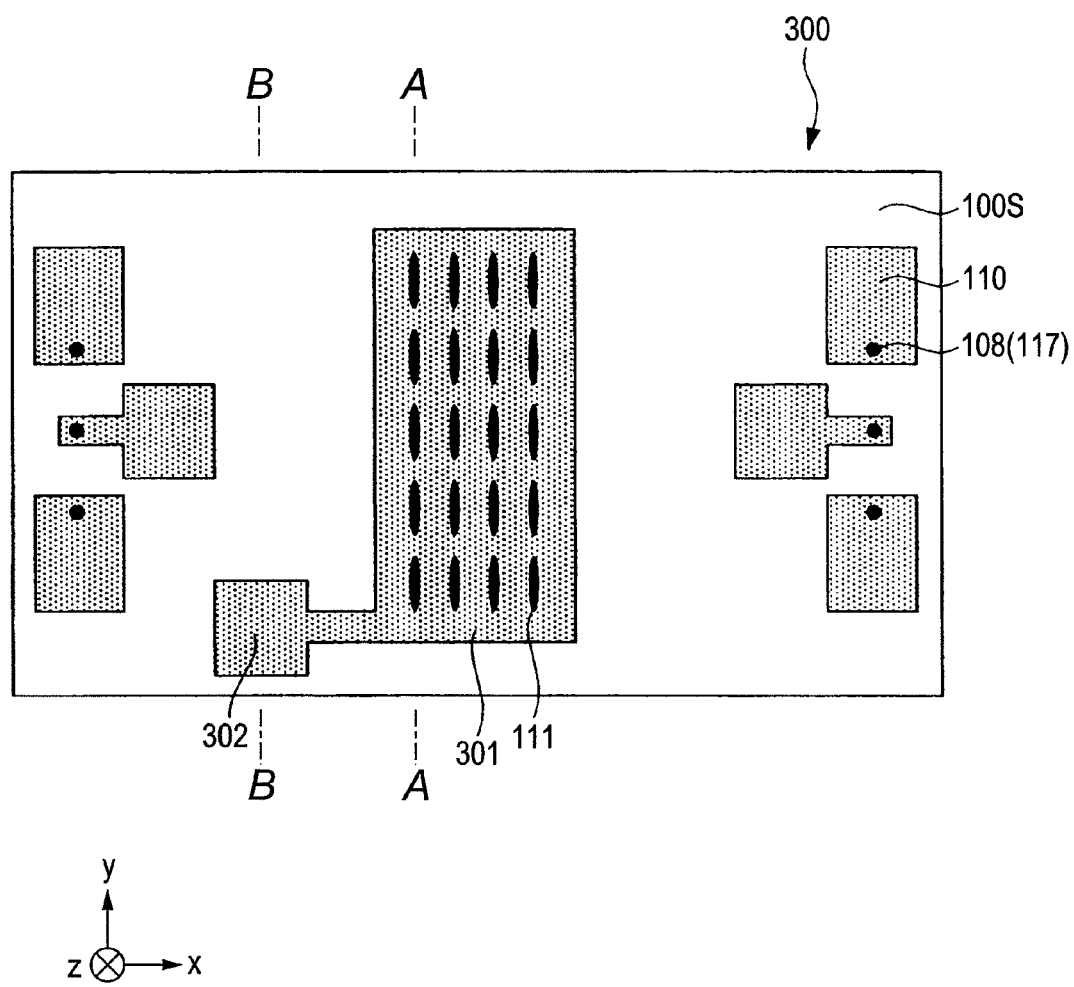
FIG. 16 is a bottom view showing the configuration of the acceleration sensor according to the second embodiment.

FIG. 16 is a bottom view showing a configuration of the acceleration sensor 300 according to the second embodiment. As shown in FIG. 16, the acceleration sensor 300 according to the second embodiment is formed on the SOI substrate 100S. The SOI substrate 100S includes a support substrate, an intermediate insulation layer formed on the support substrate, and an active layer (silicon layer) formed on the intermediate insulation layer. FIG. 16 shows a processed shape on the support substrate side.

As shown in FIG. 16, the through-hole 108 is formed on the support substrate side of the SOI substrate 100S and is filled with an electrical conducting material to form the through-hole electrode 117. The through-hole electrode 117 is electrically connected to the electrode 110 formed on the support substrate. With reference to FIGS. 15 and 16, the movable section 101 in FIG. 15 is electrically connected to the unmovable section 103 through the beam 102. The unmovable section 103 is electrically connected to the electrode 110 formed on the support substrate side through the through-hole electrode 117. Similarly, the unmovable electrode 105 in FIG. 15 is electrically connected to another electrode 110 formed on the support substrate side through another through-hole electrode 117.

As seen from this configuration, the movable section 101 (movable electrode 104) and the unmovable electrode 105 in FIG. 15 are connectable to an external circuit through the discrete electrodes 110.

As shown in FIG. 16, multiple protrusion formation holes 111 are formed in array on the support substrate side of the SOI substrate 100S. The protrusion formation holes 111 are embedded with a conductive material. The protrusion formation holes 111 are electrically connected to an electrode 301 that is electrically connected to an electrode 302. A characteristic of the acceleration sensor 300 according to the second embodiment is to provide multiple protrusion formation holes 111 and embed them with a conductive material. The characteristic structure will be described with reference to FIG. 17A.

Figure 17A:
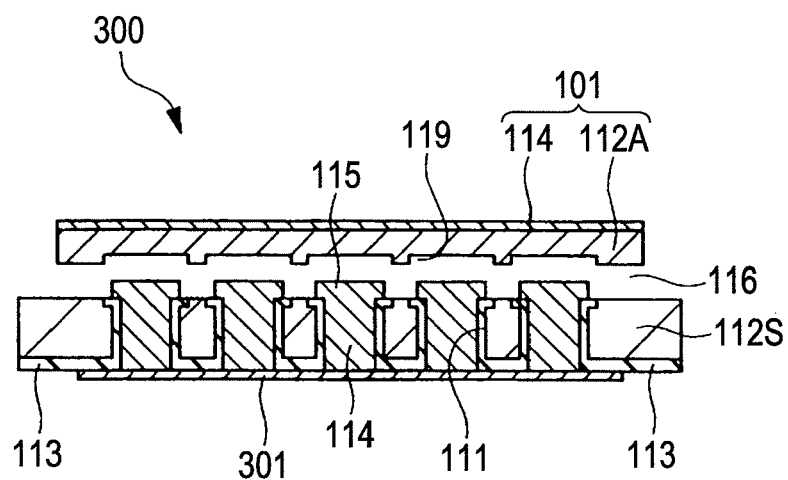
FIG. 17A is a cross sectional view taken along the line A-A of FIGS. 15 and 16.

FIG. 17A is a cross sectional view taken along the line A-A of FIGS. 15 and 16. As shown in FIG. 17A, processing an SOI substrate forms the acceleration sensor 300 according to the second embodiment. The SOI substrate includes the support substrate 112S, an intermediate insulation layer formed on the support substrate 112S, and the active layer 112A formed on the intermediate insulation layer. Specifically, the acceleration sensor 300 according to the second embodiment includes the polysilicon film 114 formed on the active layer (silicon layer). 112A. The active layer 112A and the polysilicon film 114 are integrally processed to form the movable section 101. The intermediate insulation layer below the active layer 112A forming the movable section 101 is removed to form the gap 116.

Multiple protrusion formation holes 111 are formed so as to pierce the support substrate 112S below the active layer 112A where the movable section 101 is formed. The oxide silicon film 113 is formed on the rear surface of the support substrate 112S including inner walls of the protrusion formation holes 111. The polysilicon film 114 is embedded in the protrusion formation hole 111 through the oxide silicon film 113. The polysilicon film 114 embedded in the protrusion formation hole 111 partially bulges out of the protrusion formation hole 111 toward the movable section 101 to form the protruding section 115. According to the second embodiment, the protruding section 115 protrudes from the protrusion formation hole 111 into the gap 116 that is formed by removing the intermediate insulation layer. The recessed section 119 is formed in the active layer 112A (movable section 101) above the protruding section 115 so that the protruding section 115 does not contact with the active layer 112A. The polysilicon film 114 embedded in the protrusion formation holes 111 is electrically connected to the electrode 301 formed on the rear surface of the support substrate 112S.

As a characteristic of the second embodiment, the protrusion formation holes 111 are provided so as to pierce the support substrate 112S. The protrusion formation hole 111 is embedded with the polysilicon film 114 as an electrical conducting material through the oxide silicon film 113. The polysilicon film 114 partially bulges out of the protrusion formation hole 111 toward the movable section 101 to form the protruding section 115. In other words, the second embodiment is characterized in that the polysilicon film 114 bulges out of the protrusion formation hole 111 toward the movable section 101 to form the protruding section 115. According to the second embodiment, the distance between the protruding section 115 and the movable section 101 is shorter than the distance between the support substrate 112S and the movable section 101. This prevents the movable section 101 from contacting with the support substrate 112S. As a result, the movable section 101 can be prevented from sticking to the support substrate 112S.

Figure 17B:
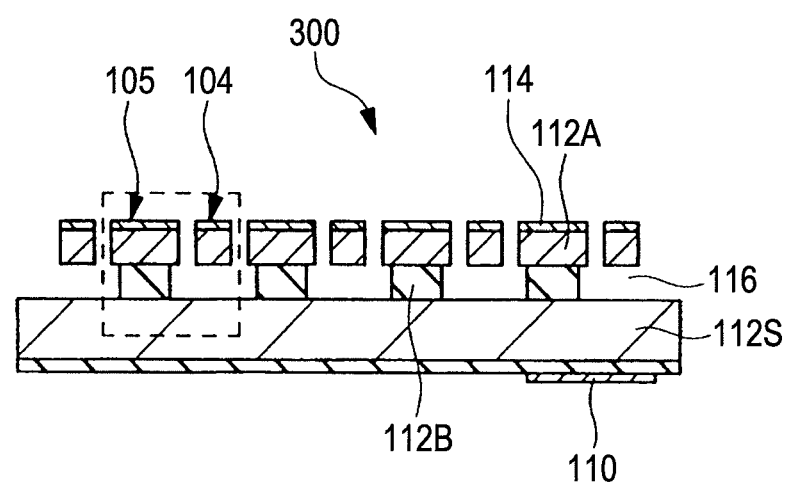
FIG. 17B is a cross sectional view taken along the line B-B of FIGS. 15 and 16.

FIG. 17B is a cross sectional view taken along the line B-B of FIGS. 15 and 16. As shown in FIG. 17B, processing the SOI substrate 100S forms the acceleration sensor 300 according to the second embodiment. The SOI substrate 100S includes the support substrate 112S, the intermediate insulation layer 112B formed on the support substrate 112S, and the active layer 112A formed on the intermediate insulation layer 112B.

Specifically, the acceleration sensor 300 according to the second embodiment includes the polysilicon film 114 formed on the active layer (silicon layer) 112A. The active layer 112A and the polysilicon film 114 are integrally processed to form the movable electrode 104 and the unmovable electrode 105. The intermediate insulation layer 112B below the active layer 112A forming the movable electrode 104 is removed to form the gap 116. On the other hand, the intermediate insulation layer 112B below the active layer 112A forming the unmovable electrode 105 remains. The unmovable section 105 is fixed to the support substrate 112S through the intermediate insulation layer 112B.

Figure 18:
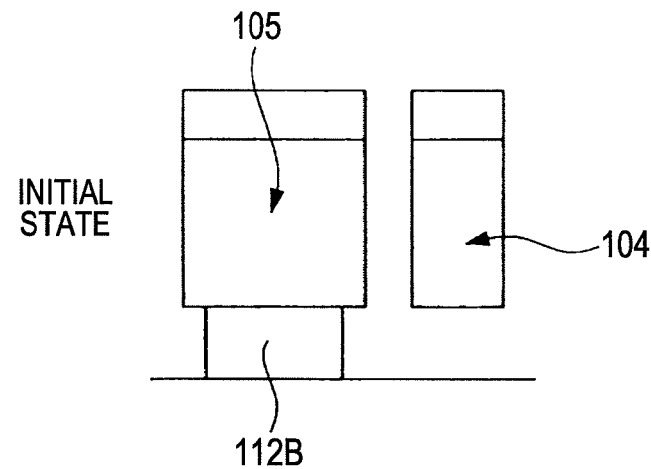
FIG. 18 is an enlarged view of a portion enclosed in the broken line in FIG. 17B and illustrates an example of acceleration detection.
Figure 18:
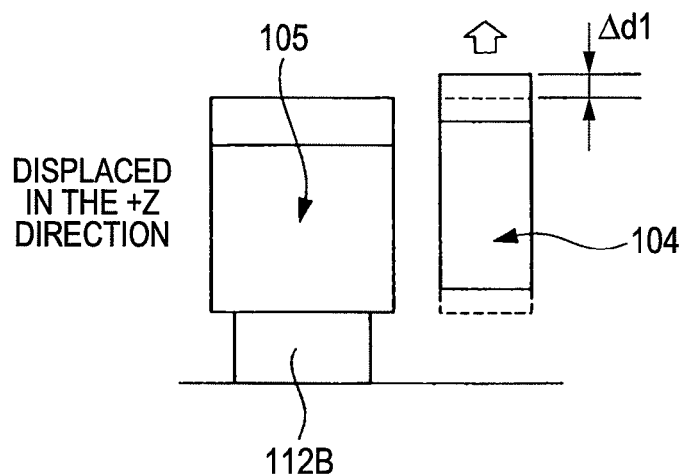
Figure 18:
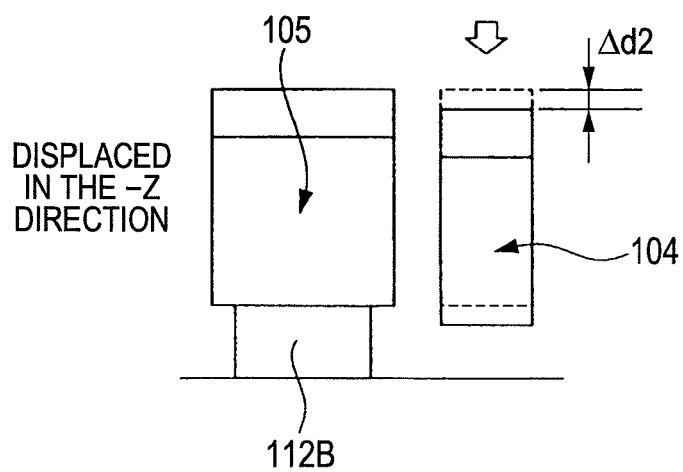

The following describes operations of the acceleration sensor 300 having the above-mentioned configuration according to the second embodiment. FIG. 18 is an enlarged view of a portion enclosed in the broken line in FIG. 17B. Operations of the acceleration sensor 300 according to the second embodiment will be described with reference to FIG. 18. As shown in FIG. 18, the movable electrode 104 and the unmovable electrode 105 are initially positioned at the same level. When an acceleration is applied in the +z direction, the unmovable electrode 105 is not displaced in the +z direction because the unmovable electrode 105 is fixed to the intermediate insulation layer 112B. On the other hand, the movable electrode 104 is displaced in the +z direction. The displacement of the movable electrode 104 is defined as $\Delta d1$. At this time, an overlap between the side of the unmovable electrode 105 and the side of the movable electrode 104 decreases. This also decreases a capacitance value of the capacitative element formed by the side of the unmovable electrode 105 and the side of the movable electrode 104 decreases. Detecting a change in the capacitance value enables the acceleration sensor 300 to detect the acceleration applied in the +z direction.

When an acceleration is applied in the −z direction, the unmovable electrode 105 is not displaced in the −z direction because the unmovable electrode 105 is fixed to the intermediate insulation layer 112B. On the other hand, the movable electrode 104 is displaced in the −z direction. The displacement of the movable electrode 104 is defined as $\Delta d2$. At this time, an overlap between the side of the unmovable electrode 105 and the side of the movable electrode 104 decreases. This also decreases a capacitance value of the capacitative element formed by the side of the unmovable electrode 105 and the side of the movable electrode 104 decreases. Detecting a change in the capacitance value enables the acceleration sensor 300 to detect the acceleration applied in the −z direction.

In the above-mentioned acceleration sensor 300, applying an acceleration in the +z or −z direction decreases a capacitance value of the capacitative element whose electrodes correspond to the side of the unmovable electrode 105 and the side of the movable electrode 104. Just reference to a change in the capacitance value cannot determine whether the acceleration is applied in the +z direction or the −z direction. To solve this problem, the acceleration sensor 300 according to the second embodiment uses the above-mentioned protruding section 115 to determine whether the acceleration is applied in the +z direction or the −z direction. Similarly to the first embodiment, the protruding section 115 according to the second embodiment functions as a stopper that prevents the movable section 101 from sticking to the support substrate 112S. In addition, the protruding section 115 according to the second embodiment has another function.

As shown in FIG. 17A, for example, the protruding sections 115 are connected to the same electrode 301 through the polysilicon film 114 embedded in the protrusion formation hole 111. When a given voltage is applied to the same electrode 301, the same voltage can be applied to all the protruding sections 115. This technique is used to generate a potential difference between the movable section 101 and the protruding sections 115. An electrostatic attractive force is generated between the movable section 101 and the protruding sections 115 to displace the movable section 101 downward.

Figure 19:
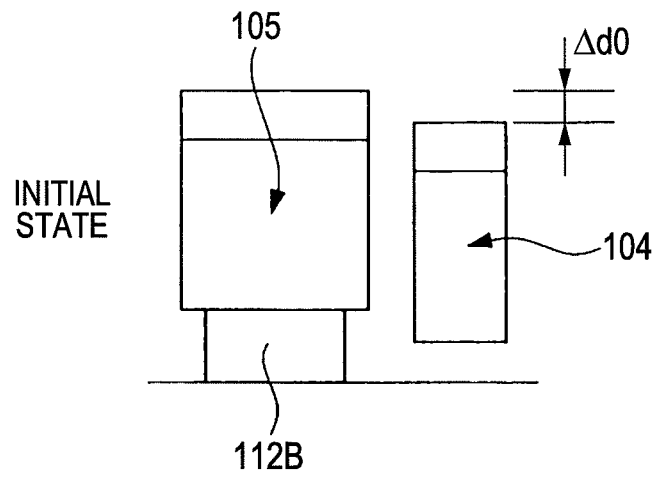
FIG. 19 is an enlarged view of a portion enclosed in the broken line in FIG. 17B and illustrates an example of acceleration detection.
Figure 19:
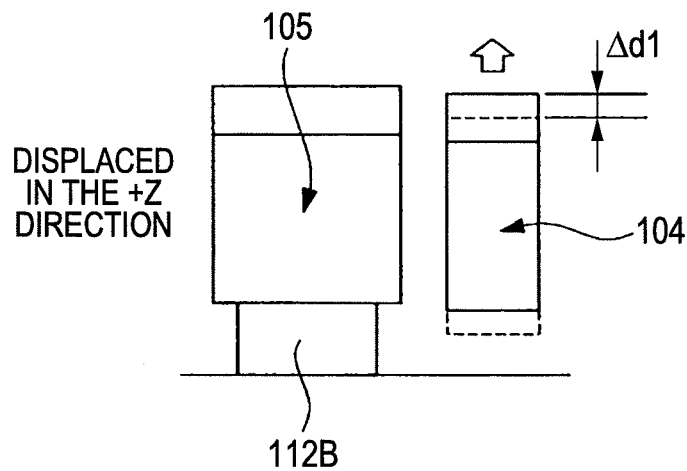
Figure 19:
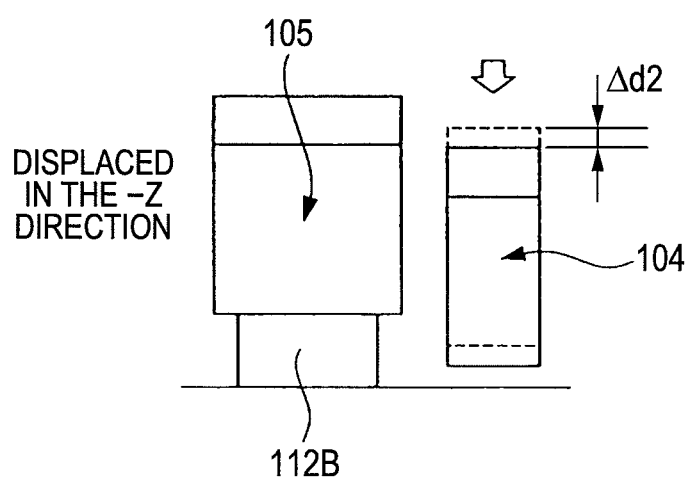

As shown in FIG. 19, the above-mentioned electrostatic attractive force can displace the movable electrode 104 (formed integrally with the movable section 101) $\Delta d0$ lower than the unmovable electrode 105 as an initial state. When an acceleration is applied in the +z direction, the movable electrode 104 is displaced $\Delta d1$ upward, for example. An overlapping area between the side of the unmovable electrode 105 and the side of the movable electrode 104 becomes larger than that in the initial state. Applying the acceleration in the +z direction increases a capacitance value of the capacitative element whose electrodes correspond to the side of the unmovable electrode 105 and the side of the movable electrode 104.

When an acceleration is applied in the −z direction, the movable electrode 104 is displaced $\Delta d2$ downward, for example. An overlapping area between the side of the unmovable electrode 105 and the side of the movable electrode 104 becomes smaller than that in the initial state. Applying the acceleration in the −z direction decreases a capacitance value of the capacitative element whose electrodes correspond to the side of the unmovable electrode 105 and the side of the movable electrode 104.

When a potential difference is initially applied between the protruding section 115 and the movable section 101, an electrostatic attractive force can displace the movable electrode 104 from the position of the unmovable electrode 105. As a result, applying the acceleration in the +z direction can increase the capacitance value of the capacitative element. Applying the acceleration in the −z direction can decrease the capacitance value of the capacitative element. Even when accelerations of the same magnitude are applied in opposite directions, the acceleration sensor 300 according to the second embodiment can determine whether each of the accelerations is applied in the +z direction or the −z direction. As mentioned above, the second embodiment is characterized in that the protruding section 115 can not only function as a stopper but also determine the acceleration direction.

Third Embodiment

The third embodiment will describe an example of applying the technical concept of the invention to an acceleration sensor capable of detecting acceleration in the z direction using a capacitative element including the movable section as an upper electrode and the protruding section as a lower electrode.

Figure 20:
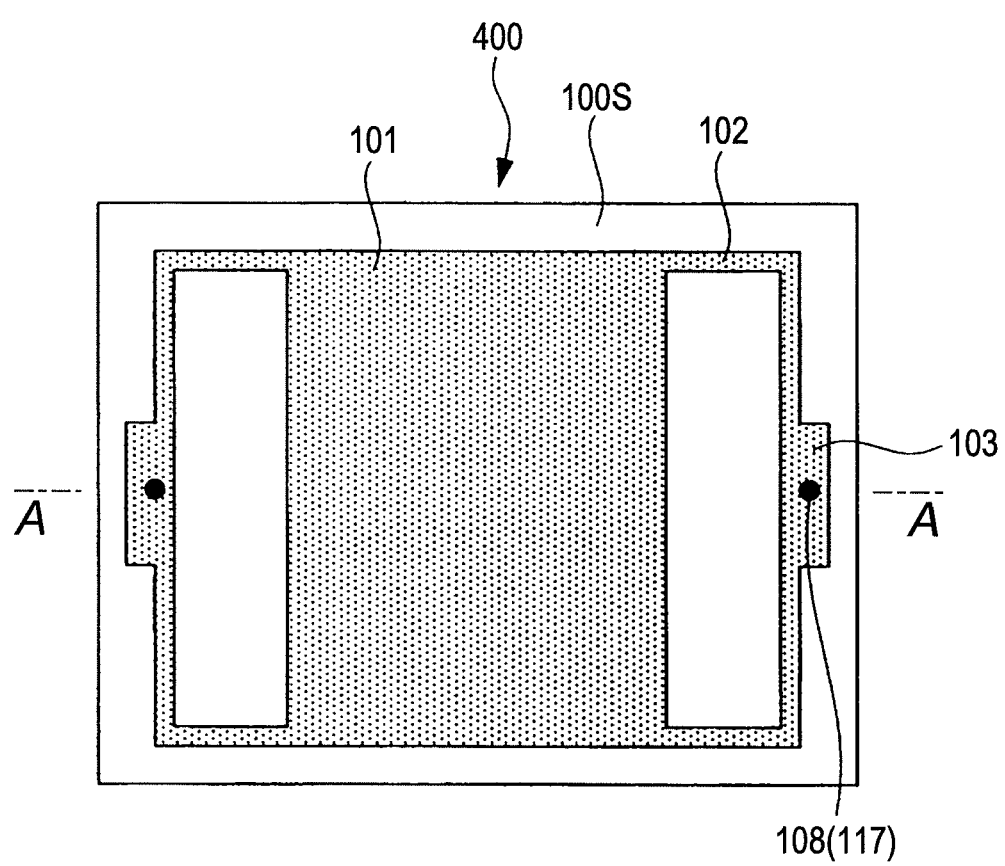
FIG. 20 is a top view showing a configuration of an acceleration sensor according to a third embodiment.

FIG. 20 is a top view showing a configuration of an acceleration sensor 400 according to the third embodiment. As shown in FIG. 20, the acceleration sensor 400 according to the third embodiment is formed on the SOI substrate 100S. The SOI substrate 100S includes a support substrate, an intermediate insulation layer formed on the support substrate, and an active layer (silicon layer) formed on the intermediate insulation layer. FIG. 20 shows a processed shape of the active layer (silicon layer).

As shown in FIG. 20, the acceleration sensor 400 according to the third embodiment includes the movable section 101, the beam (elastic deformation section) 102, and the unmovable section 103. The movable section 101 is connected to the unmovable section 103 through the beam 102. The movable section 101 can be displaced in accordance with acceleration acting on the acceleration sensor 400. Specifically, the beam 102 is configured to be elastically deformable. The movable section 101 is connected to one end of the beam 102. The unmovable section 103 is connected to the other end of the beam 102. For example, applying acceleration in the z direction elastically deforms the beam 102. The movable section 101 connected to the elastically deforming beam 102 is displaced in the z direction. Applying acceleration in the z direction to the acceleration sensor 400 according to the third embodiment elastically deforms the beam 102 to displace the movable section 101 in the z direction while the movable section 101 is connected to one end of the beam 102. When acceleration is applied in the z direction to the acceleration sensor 400 according to the third embodiment, the movable section 101 is displaced in the z direction in accordance with the magnitude and the direction of the acceleration.

Processing the active layer of the SOI substrate 100S forms the movable section 101. The intermediate insulation layer formed below the active layer included in the movable section 101 is removed so that the movable section 101 can be displaced. As shown in FIG. 20, the movable section 101 is not provided with an etching hole. For example, the movable section 101 may be provided with an etching hole so as to easily remove the intermediate insulation layer below the movable section 101.

In the acceleration sensor 400 according to the third embodiment, the movable section 101 is connected to the unmovable section 103 through the beam 102. The movable section 101, the beam 102, and the unmovable section 103 are made of conductive active layers (silicon layers). The movable section 101, the beam 102, and the unmovable section 103 are therefore connected mechanically and electrically. The through-hole 108 is formed in the unmovable section 103 and is filled with an electrical conducting material to form the through-hole electrode 117.

Figure 21:
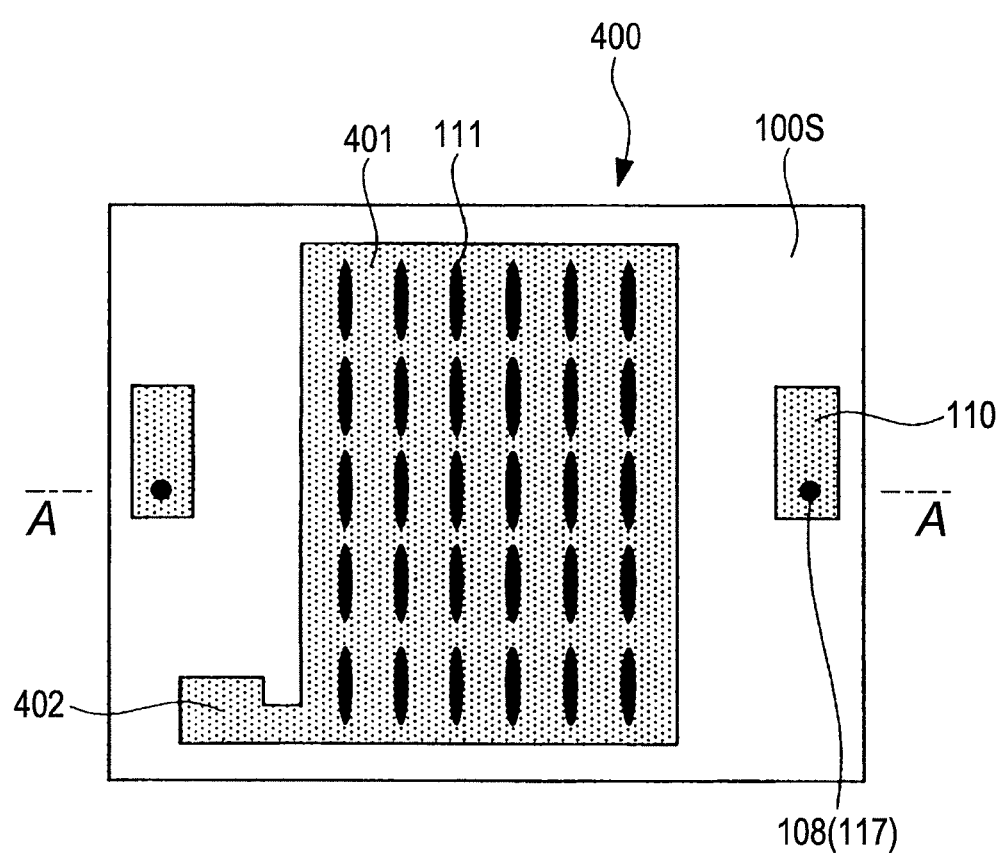
FIG. 21 is a top view showing a configuration of the acceleration sensor according to the third embodiment.

FIG. 21 is a bottom view showing a configuration of the acceleration sensor 400 according to the third embodiment. As shown in FIG. 21, the acceleration sensor 400 according to the third embodiment is formed on the SOI substrate 100S. The SOI substrate 100S includes a support substrate, an intermediate insulation layer formed on the support substrate, and an active layer (silicon layer) formed on the intermediate insulation layer. FIG. 21 shows a processed shape on the support substrate side.

As shown in FIG. 21, the through-hole 108 is formed on the support substrate side of the SOI substrate 100S and is filled with an electrical conducting material to form the through-hole electrode 117. The through-hole electrode 117 is electrically connected to the electrode 110 formed on the support substrate. With reference to FIGS. 20 and 21, the movable section 101 in FIG. 20 is electrically connected to the unmovable section 103 through the beam 102. The unmovable section 103 is electrically connected to the electrode 110 formed on the support substrate side through the through-hole electrode 117.

As seen from this configuration, the movable section 101 in FIG. 20 is connectable to an external circuit through the discrete electrodes 110 shown in FIG. 20.

As shown in FIG. 21, multiple protrusion formation holes 111 are formed in array on the support substrate side of the SOI substrate 100S. The protrusion formation holes 111 are embedded with a conductive material. The protrusion formation holes 111 are electrically connected to an electrode 401 that is electrically connected to an electrode 402. A characteristic of the acceleration sensor 400 according to the third embodiment is to provide multiple protrusion formation holes 111 and embed them with a conductive material. The characteristic structure will be described with reference to FIG. 22.

Figure 22:
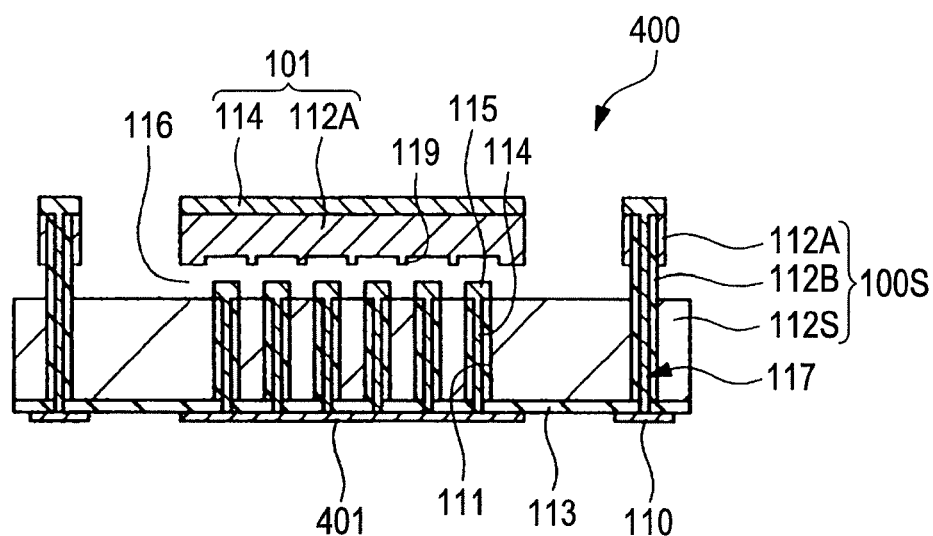
FIG. 22 is a cross sectional view taken along the line A-A of FIGS. 20 and 21.

FIG. 22 is a cross sectional view taken along the line A-A of FIGS. 20 and 21. As shown in FIG. 22, processing an SOI substrate forms the acceleration sensor 400 according to the third embodiment. The SOI substrate includes the support substrate 112S, the intermediate insulation layer 112B formed on the support substrate 112S, and the active layer 112A formed on the intermediate insulation layer 112B. Specifically, the acceleration sensor 400 according to the third embodiment includes the polysilicon film 114 formed on the active layer (silicon layer) 112A. The active layer 112A and the polysilicon film 114 are integrally processed to form the movable section 101. The intermediate insulation layer 112B below the active layer 112A forming the movable section 101 is removed to form the gap 116.

Multiple protrusion formation holes 111 are formed sous to pierce the support substrate 112S below the active layer 112A where the movable section 101 is formed. The oxide silicon film 113 is formed on the rear surface of the support substrate 112S including inner walls of the protrusion formation holes 111. The polysilicon film 114 is embedded in the protrusion formation hole 111 through the oxide silicon film 113. The polysilicon film 114 embedded in the protrusion formation hole 111 partially bulges out of the protrusion formation hole 111 toward the movable section 101 to form the protruding section 115. According to the third embodiment, the protruding section 115 protrudes from the protrusion formation hole 111 into the gap 116 that is formed by removing the intermediate insulation layer 112B. The recessed section 119 is formed in the active layer 112A (movable section 101) above the protruding section 115 so that the protruding section 115 does not contact with the active layer 112A. The polysilicon film 114 embedded in the protrusion formation holes 111 is electrically connected to the electrode 401 formed on the rear surface of the support substrate 112S.

As a characteristic of the third embodiment, the protrusion formation holes 111 are provided so as to pierce the support substrate 112S. The protrusion formation hole 111 is embedded with the polysilicon film 114 as an electrical conducting material through the oxide silicon film 113. The polysilicon film 114 partially bulges out of the protrusion formation hole 111 toward the movable section 101 to form the protruding section 115. In other words, the third embodiment is characterized in that the polysilicon film 114 bulges out of the protrusion formation hole 111 toward the movable section 101 to form the protruding section 115. According to the third embodiment, the distance between the protruding section 115 and the movable section 101 is shorter than the distance between the support substrate 112S and the movable section 101. This prevents the movable section 101 from contacting with the support substrate 112S. As a result, the movable section 101 can be prevented from sticking to the support substrate 112S.

According to the third embodiment, the protruding section 115 also functions as a lower electrode. The acceleration sensor 400 according to the third embodiment detects an acceleration in the thickness direction (z direction) of the SOI substrate 100S. That is, the acceleration sensor 400 detects an acceleration based on a change in the capacitance of the capacitative element that includes the movable section 101 as an upper electrode and the protruding sections 115 as lower electrodes. The third embodiment is characterized in that the protruding sections 115 function not only as a stopper for preventing the movable section 101 from sticking to the support substrate 112S but also as lower electrodes of the capacitative element for detecting an acceleration.

Generally on the SOI substrate 100S, the active layer 112A is processed to form the movable section 101. The intermediate insulation layer 112B formed below the movable section 101 is removed. In this manner, the movable section 101 can be displaced. The acceleration sensor detects an acceleration applied in the thickness direction (z direction) of the SOI substrate 100S. The movable section 101 functions as an upper electrode. A lower electrode is formed below the movable section 101. The upper electrode and the lower electrode provide a capacitative element. For example, the acceleration sensor may detect an acceleration based on a change in the capacitance of the capacitative element. However, it is difficult to form a lower electrode (wiring layer) below the movable section 101 on the normal SOI substrate 100S. By contrast, the third embodiment provides the protruding sections 115 as a stopper that prevents the movable section 101 from sticking to the support substrate 112S. The protruding sections 115 are used as lower electrodes. In other words, the third embodiment uses the protruding sections 115 as a stopper and lower electrodes. Accordingly, even the acceleration sensor 400 formed on the SOI substrate 100S can provide the capacitative element that includes the movable section 101 as an upper electrode and the protruding sections 115 as lower electrodes. The acceleration sensor 400 can detect an acceleration in the z direction based on a change in the capacitance of the capacitative element.

With reference to FIG. 22, the following describes operations of the acceleration sensor 400 having the above-mentioned configuration according to the third embodiment. As shown in FIG. 22, multiple protruding sections 115 are formed below the movable section 101 through the gap 116. The capacitative element includes the movable section 101 as an upper electrode and the protruding sections 115 as lower electrodes and detects an acceleration. Let us suppose that an upward (+z direction) acceleration is applied in the thickness direction of the SOI substrate 100S. In this case, the movable section 101 is displaced in the +z direction. The protruding sections 115 remain fixed. As a result, the distance between the movable section 101 and the protruding sections 115 increases. This signifies a decrease in the capacitance value of the capacitative element including the movable section 101 and the protruding sections 115. Detecting a decrease in the capacitance value can detect the acceleration in the +z direction.

Let us suppose that a downward (−z direction) acceleration is applied in the thickness direction of the SOI substrate 100S. In this case, the movable section 101 is displaced in the −z direction. The protruding sections 115 remain fixed. As a result, the distance between the movable section 101 and the protruding sections 115 decreases. This signifies an increase in the capacitance value of the capacitative element including the movable section 101 and the protruding sections 115. Detecting an increase in the capacitance value can detect the acceleration in the −z direction.

When the acceleration applied in the −z direction is too large, the movable section 101 may contact with the support substrate 112S and stick to it. According to the third embodiment, the protruding section 115 is formed immediately below the movable section 101 on the support substrate 112S. The distance between the protruding section 115 and the movable section 101 is smaller than the distance between the movable section 101 and the support substrate 112S. The movable section 101 first contacts with the protruding section 115 even when a large acceleration is applied in the −z direction to greatly displace the movable section 101. When the movable section 101 is displaced in the thickness direction of the SOI substrate 100S, the movable section 101 first contacts with the protruding section 115. The end of the protruding section 115 is small. Therefore, there may be a small contact area between the movable section 101 and the protruding section 115 when they contact with each other. The movable section 101 hardly sticks to the protruding section 115 even when they contact with each other. The movable section 101 is considered to stick to the support substrate 112S when most part of the area of the movable section 101 contacts with the support substrate 112S. According to the third embodiment, the movable section 101 contacts with the protruding section 115 having a small area and can be prevented from sticking. According to the third embodiment, the polysilicon film 114 bulges out of the protrusion formation hole 111 toward the movable section 101 to form the protruding section 115. The distance between the protruding section 115 and the movable section 101 is configured to be smaller than the distance between the support substrate 112S and the movable section 101. It is possible to prevent sticking between the movable section 101 and the support substrate 112S. The third embodiment can provide a remarkable effect of improving reliability of the acceleration sensor 400.

Fourth Embodiment

Figure 23:
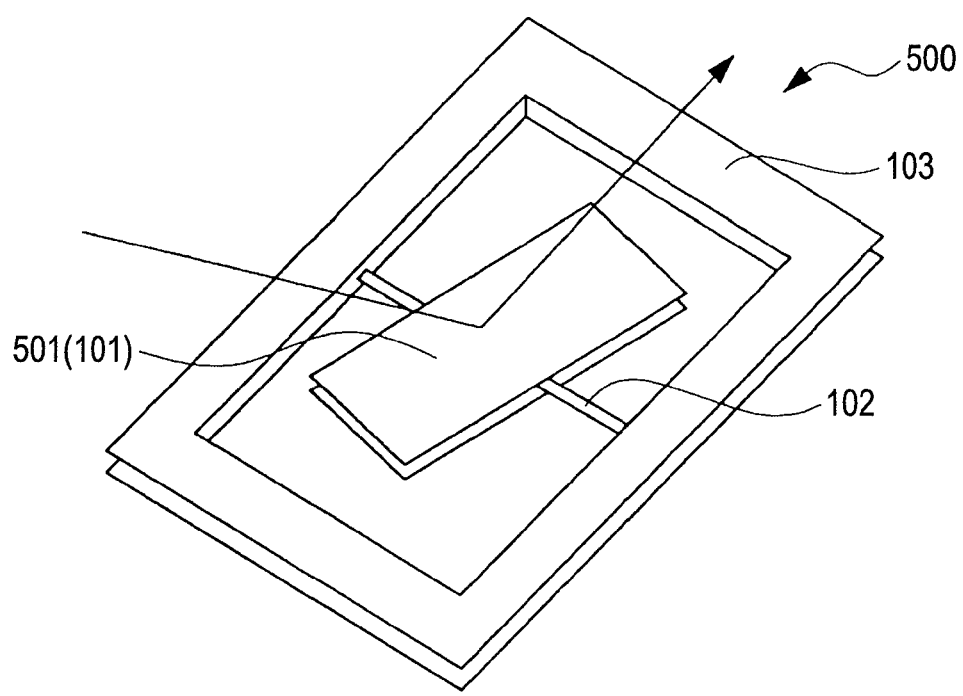
FIG. 23 is a perspective view showing a configuration of a micromirror according to a fourth embodiment.

The fourth embodiment will describe an example of applying the technical concept of the invention to a micromirror as an example of the MEMS device. FIG. 23 is a perspective view showing a configuration of a micromirror 500 according to the fourth embodiment. The micromirror 500 is an optical part including a mirror formed on monocrystal silicon. An electrostatic force is used to move the micromirror 500. For example, the micromirror 500 is used for scanning an image by radiating laser onto the mirror surface. In FIG. 23, the beam 102 supports a mirror 501 (movable section 101) and is connected to the unmovable section 103.

Figure 24:
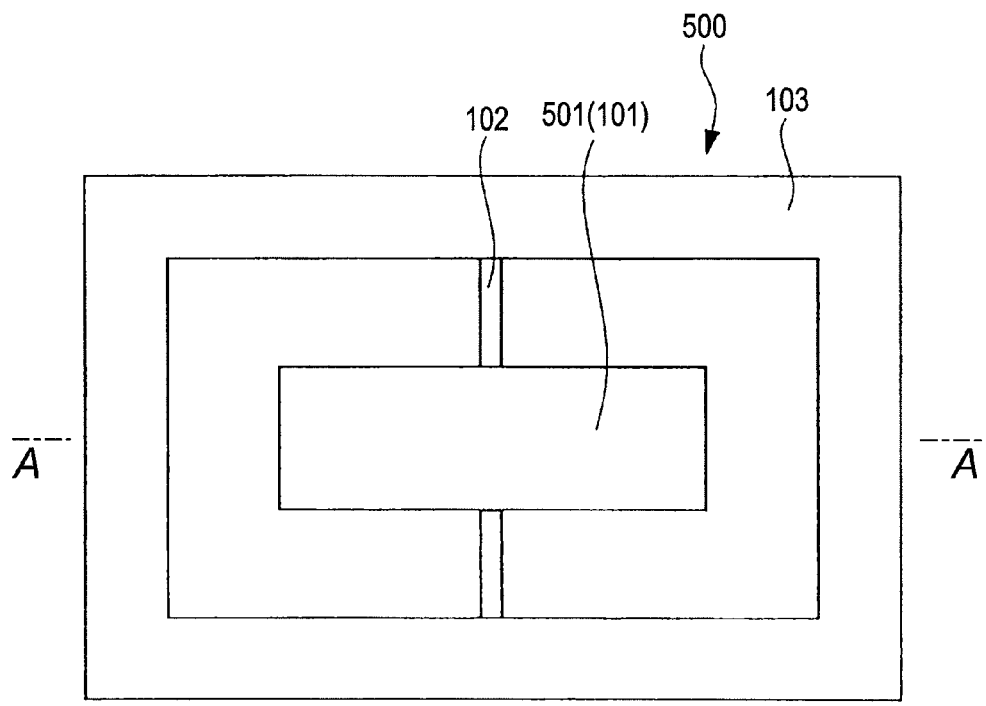
FIG. 24 is a plan view showing the configuration of the micromirror according to the fourth embodiment.

The following describes the configuration of the micromirror 500 according to the fourth embodiment. FIG. 24 is a plan view showing the configuration of the micromirror 500 according to the fourth embodiment. As shown in FIG. 24, the micromirror 500 according to the fourth embodiment is formed on an SOI substrate. The SOI substrate includes a support substrate, an intermediate insulation layer formed on the support substrate, and an active layer (silicon layer) formed on the intermediate insulation layer. FIG. 24 shows a processed shape of the active layer (silicon layer).

As shown in FIG. 24, the micromirror 500 according to the fourth embodiment includes the movable section 101 functioning as the mirror 501, the beam (elastic deformation section) 102, and the unmovable section 103. The beam 102 supports the mirror 501 (movable section 101) and is connected to the unmovable section 103.

Figure 25:
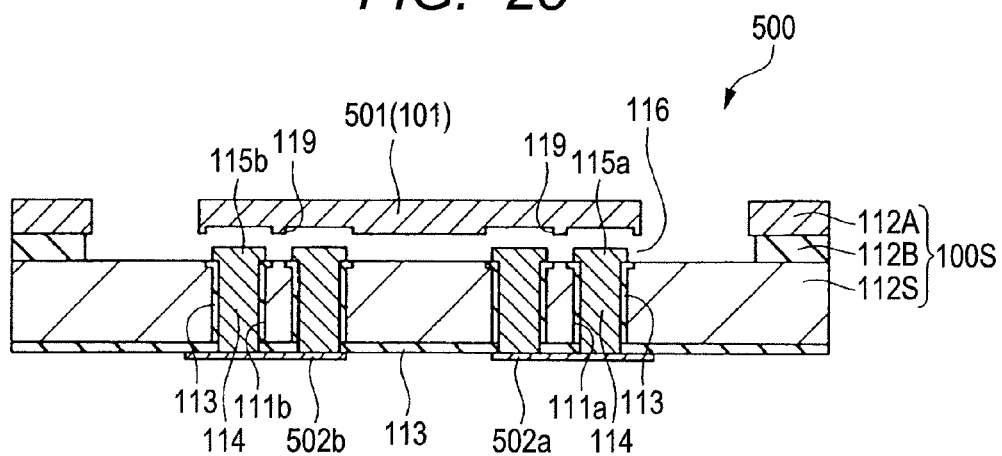
FIG. 25 is a cross sectional view taken along the line A-A of FIG. 24.

FIG. 25 is a cross sectional view taken along the line A-A of FIG. 24. As shown in FIG. 25, processing the SOI substrate 100S forms the micromirror 500 according to the fourth embodiment. The SOI substrate 100S includes the support substrate 112S, the intermediate insulation layer 112B formed on the support substrate 112S, and the active layer 112A formed on the intermediate insulation layer 112B. Specifically, the micromirror 500 according to the fourth embodiment includes the mirror 501 (movable section 101) formed by processing the active layer (monocrystal silicon layer) 112A. The intermediate insulation layer 112B below the active layer 112A forming the movable section 101 is removed to form the gap 116. Protrusion formation holes 111a and 111b are formed so as to pierce the support substrate 112S below the active layer 112A where the mirror 501 (movable section 101) is formed. In other words, the protrusion formation holes 111a and 111b are formed so as to horizontally overlap with the mirror 501 (movable section 101). The oxide silicon film 113 is formed on the rear surface of the support substrate 112S including inner walls of the protrusion formation holes 111a and 111b. The polysilicon film 114 is embedded in the protrusion formation holes 111a and 111b through the oxide silicon film 113. The polysilicon film 114 embedded in the protrusion formation holes 111a and 111b partially bulges out of the protrusion formation holes 111a and 111b toward the mirror 501 (movable section 101) to form protruding sections 115a and 115b. According to the fourth embodiment, the protruding sections 115a and 115b protrude from the protrusion formation holes 111a and 111b into the gap 116 formed by removing the intermediate insulation layer 112B. The recessed section 119 is formed in the active layer 112A (mirror 501) above the protruding sections 115a and 115b to prevent the protruding sections 115a and 115b from contacting with the active layer 112A. The polysilicon film 114 embedded in the protrusion formation hole 111a is electrically connected with an electrode 502a formed on the rear surface of the support substrate 112S. Similarly, the polysilicon film 114 embedded in the protrusion formation hole 111b is electrically connected with an electrode 502b formed on the rear surface of the support substrate 112S.

The fourth embodiment is characterized as follows. The protrusion formation holes 111a and 111b are provided so as to pierce the support substrate 112S. The polysilicon film 114 as an electrical conducting material is embedded in the protrusion formation holes 111a and 111b through the oxide silicon film 113. The polysilicon film 114 partially bulges out of the protrusion formation holes 111a and 111b toward the movable section 101 to form the protruding sections 115a and 115b. In other words, the fourth embodiment is characterized in that the polysilicon film 114 bulges out of the protrusion formation holes 111a and 111b toward the movable section 101 to form the protruding sections 115a and 115b. According to the fourth embodiment, the distance between the mirror 501 (movable section 101) and the protruding sections 115a and 115b is shorter than the distance between the mirror 501 and the support substrate 112S. This can prevent the mirror 501 from contacting with the support substrate 112S. As a result, the mirror 501 can be prevented from sticking to the support substrate 112S.

In addition, the protruding sections 115a and 115b according to the fourth embodiment have another function of adjusting an angle of the mirror 501 (movable section 101). The function will be described below. In FIG. 25, the protruding section 115a is connected with the electrode 502a through the polysilicon film 114 embedded in the protrusion formation hole 111a. Similarly, the protruding section 115b is connected with the electrode 502b through the polysilicon film 114 embedded in the protrusion formation hole 111b. For example, a voltage is applied from the electrode 502a to the protruding section 115a to cause a potential difference between the mirror 501 and the protruding section 115a. Then, an electrostatic force acts between the mirror 501 and the protruding section 115a. Specifically, a potential difference is applied between the mirror 501 and the protruding section 115a so that an electrostatic attractive force acts between them. As a result, the mirror 501 tilts to the right in FIG. 25. In this manner, an angle of the mirror 501 can be adjusted. Similarly, a voltage is applied from the electrode 502b to the protruding section 115b to cause a potential difference between the mirror 501 and the protruding section 115b. Then, an electrostatic force acts between the mirror 501 and the protruding section 115b. Specifically, a potential difference is applied between the mirror 501 and the protruding section 115b so that an electrostatic attractive force acts between them. As a result, the mirror 501 tilts to the left in FIG. 25. In this manner, an angle of the mirror 501 can be adjusted. Adjusting a voltage applied to the protruding section 115a or 115b can adjust an angle of the mirror 501. As seen from the above, the protruding sections 115a and 115b according to the fourth embodiment not only function as a stopper to prevent the mirror 501 from sticking to the support substrate 112S but also adjust an angle of the mirror 501.

In the related art, for example, a mirror and an angle adjustment electrode cannot be formed on a single substrate. A micromirror of the related art requires a process of bonding a substrate for forming the mirror and a substrate for forming the angle adjustment electrode together. By contrast, the fourth embodiment uses the protruding sections 115a and 115b as the stopper and the angle adjustment electrodes. The mirror and the angle adjustment electrodes (protruding sections 115a and 115b) can be formed on a single SOI substrate. The process of bonding substrates can be omitted. As a result, the micromirror 500 according to the fourth embodiment can improve production efficiency.

Fifth Embodiment

The fifth embodiment will describe an example of applying the technical concept of the invention to a microlens actuator as an example of the MEMS device. The microlens actuator accurately moves a microlens up and down to focus laser light entering the microlens and radiates the laser light to an optical disk.

Figure 26:
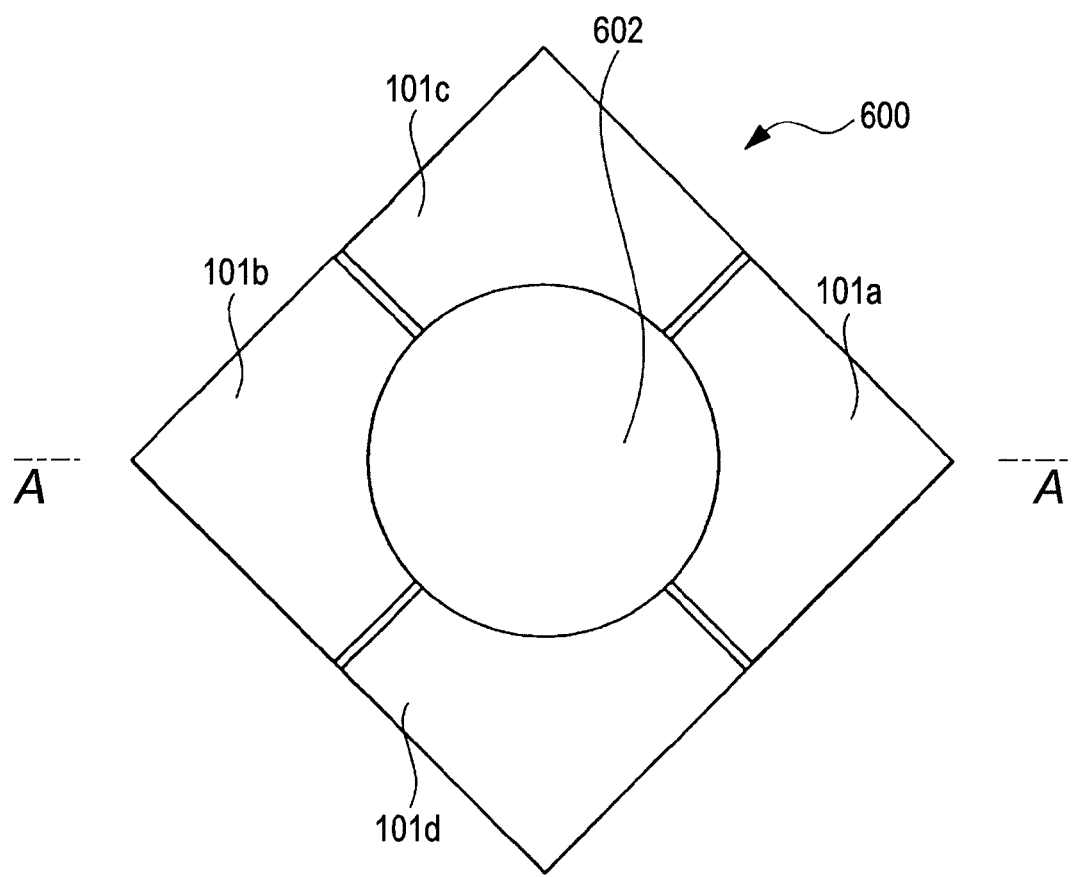
FIG. 26 is a plan view showing a configuration of a microlens actuator according to a fifth embodiment.

FIG. 26 is a plan view showing a configuration of a microlens actuator 600 according to the fifth embodiment. As shown in FIG. 26, the microlens actuator 600 according to the fifth embodiment includes four separate lens holding sections 101a through 101d. The four lens holding sections 101a through 101d hold a microlens 602. The four lens holding sections 101a through 101d can be independently displaced up and down (vertically on the drawing). Adjusting the displacement of the lens holding sections 101a through 101d can adjust the microlens position and tilt.

Figure 27:
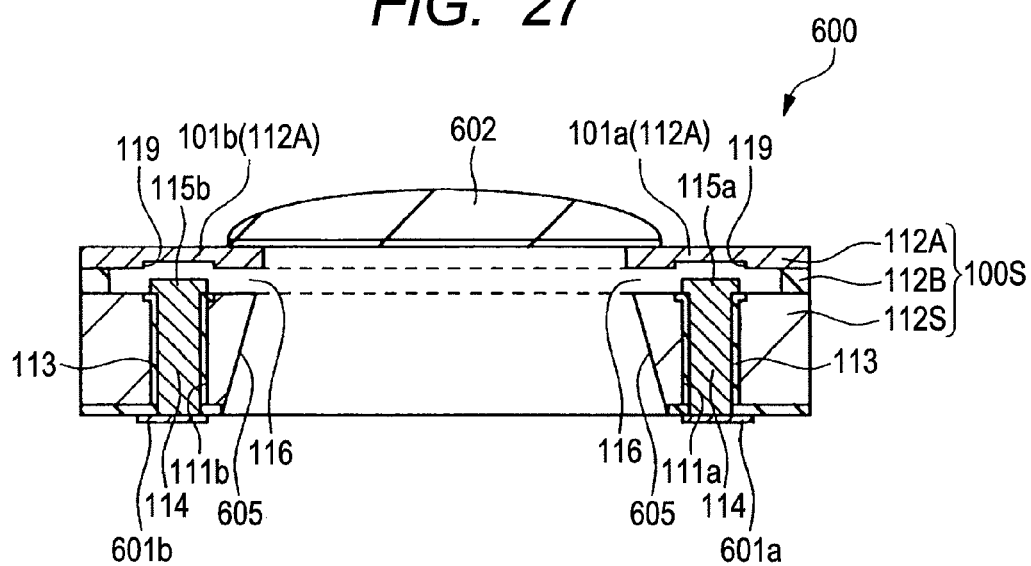
FIG. 27 is a cross sectional view taken along the line A-A of FIG. 26.

FIG. 27 is a cross sectional view taken along the line A-A of FIG. 26. As shown in FIG. 27, processing the SOI substrate 100S forms the microlens actuator 600 according to the fifth embodiment. The SOI substrate 100S includes the support substrate 112S, the intermediate insulation layer 112B formed on the support substrate 112S, and the active layer 112A formed on the intermediate insulation layer 112B. Specifically, the microlens actuator 600 according to the fifth embodiment is provided with a large opening 605 formed in the SOI substrate 100S at its center so as to pierce the SOI substrate 100S. The microlens 602 is placed over the opening 605. The active layer (silicon layer) 112A is processed to form the lens holding sections 101a and 101b. The intermediate insulation layer 112B below the active layer 112A forming the lens holding sections 101a and 101b is partially removed to form the gap 116. The lens holding sections 101a and 101b are configured to integrally include the movable section, the beam, and the unmovable section formed by processing the active layer 112A.

The protrusion formation holes 111a and 111b are formed so as to pierce the support substrate 112S below the active layer 112A where the lens holding sections 101a and 101b are formed. In other words, the protrusion formation holes 111a and 111b are formed so as to horizontally overlap with the lens holding sections 101a and 101b. The oxide silicon film 113 is formed on the rear surface of the support substrate 112S including inner walls of the protrusion formation holes 111a and 111b. The polysilicon film 114 is embedded in the protrusion formation holes 111a and 111b through the oxide silicon film 113. The polysilicon film 114 embedded in the protrusion formation holes 111a and 111b partially bulges out of the protrusion formation holes 111a and 111b toward the lens holding sections 101a and 101b to form the protruding sections 115a and 115b. According to the fifth embodiment, the protruding sections 115a and 115b protrude from the protrusion formation holes 111a and 111b into the gap 116 formed by removing the intermediate insulation layer 112B. The recessed section 119 is formed in the active layer 112A above the protruding sections 115a and 115b to prevent the protruding sections 115a and 115b from contacting with the active layer 112A. The polysilicon film 114 embedded in the protrusion formation hole 111a is electrically connected with an electrode 601a formed on the rear surface of the support substrate 112S. Similarly, the polysilicon film 114 embedded in the protrusion formation hole 111b is electrically connected with an electrode 601b formed on the rear surface of the support substrate 112S.

The fifth embodiment is characterized as follows. The protrusion formation holes 111a and 111b are provided so as to pierce the support substrate 112S. The polysilicon film 114 as an electrical conducting material is embedded in the protrusion formation holes 111a and 111b through the oxide silicon film 113. The polysilicon film 114 partially bulges out of the protrusion formation holes 111a and 111b toward the lens holding sections 101a and 101b to form the protruding sections 115a and 115b. In other words, the fifth embodiment is characterized in that the polysilicon film 114 bulges out of the protrusion formation holes 111a and 111b toward the lens holding sections 101a and 101b to form the protruding sections 115a and 115b. According to the fifth embodiment, the distance between the protruding section 115a or 115b and the lens holding section 101a or 101b is shorter than the distance between the support substrate 112S and the lens holding section 101a or 101b. This can prevent the lens holding sections 101a and 101b from contacting with the support substrate 112S. As a result, the lens holding sections 101a and 101b can be prevented from sticking to the support substrate 112S.

The protruding sections 115a and 115b according to the fifth embodiment has another function of adjusting the position and the tilt of the microlens 602. This function will be described below. As shown in FIG. 27, the protruding section 115a is connected to the electrode 601a through the polysilicon film 114 embedded in the protrusion formation hole 111a. Similarly, the protruding section 115b is connected to the electrode 601b through the polysilicon film 114 embedded in the protrusion formation hole 111b. When the electrode 601a applies a voltage to the protruding section 115a, for example, a potential difference is caused between the lens holding section 101a and the protruding section 115a. An electrostatic force then acts between the lens holding section 101a and the protruding section 115a. Specifically, a potential difference is applied between the lens holding section 101a and the protruding section 115a so that an electrostatic attractive force acts between the lens holding section 101a and the protruding section 115a. In FIG. 27, the lens holding section 101a is displaced downward so as to be attracted by the protruding section 115a. As a result, it is possible to adjust the position and the tilt of the microlens 602 supported by the lens holding section 101a. When the electrode 601b applies a voltage to the protruding section 115b, a potential difference is caused between the lens holding section 101b and the protruding section 115b. An electrostatic force then acts between the lens holding section 101b and the protruding section 115b. Specifically, a potential difference is applied between the lens holding section 101b and the protruding section 115b so that an electrostatic attractive force acts between the lens holding section 101b and the protruding section 115b. In FIG. 27, the lens holding section 101b is displaced downward so as to be attracted by the protruding section 115b. As a result, it is possible to adjust the position and the tilt of the microlens 602 supported by the lens holding section 101b. In other words, adjusting a voltage applied to the protruding section 115a or 115b can adjust the position and the tilt of the microlens 602 supported by the lens holding section 101a or 101b. The protruding sections 115a and 115b according to the fifth embodiment has not only a function as a stopper for preventing the lens holding sections 101a and 101b from sticking to the support substrate 112S but also a function of adjusting the position and the tilt of the microlens 602 supported by the lens holding sections 101a and 101b.

Figure 28:
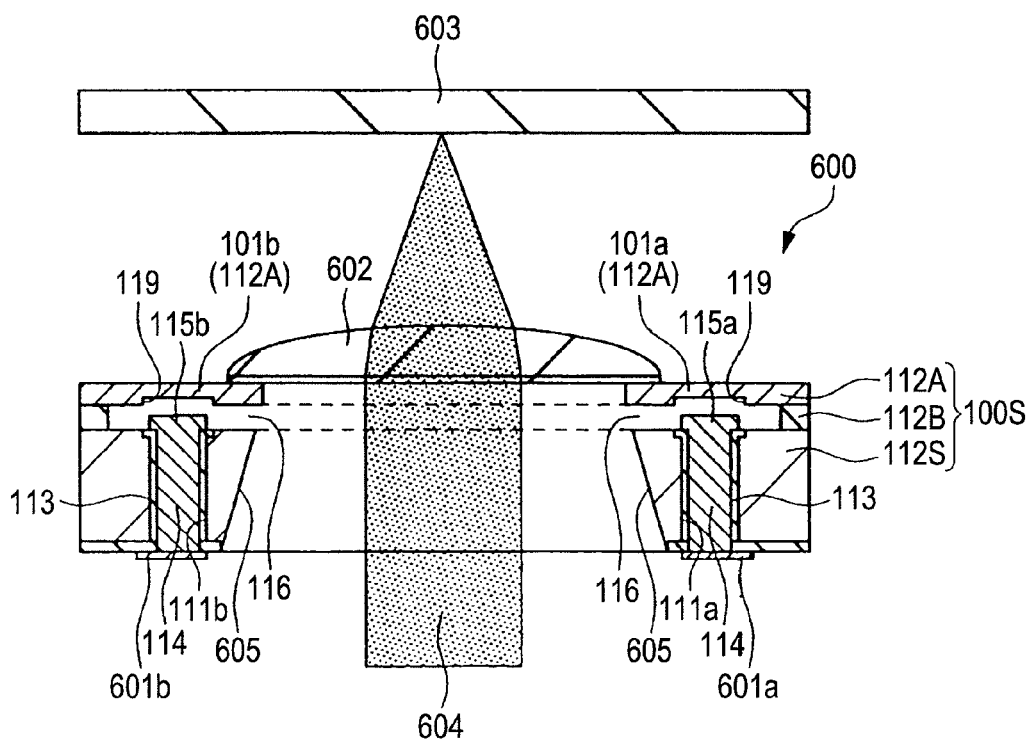
FIG. 28 is a cross sectional view showing an example of radiating laser light to the microlens actuator according to the fifth embodiment.

FIG. 28 is a cross sectional view showing an example of radiating laser light to the microlens actuator 600 according to the fifth embodiment. As shown in FIG. 28, laser light 604 is radiated from the rear surface side of the SOI substrate 100S, passes through the opening 605 formed in the SOI substrate 100S, and enters the microlens 602. The laser light 604 incident on the microlens 602 converges and focuses on an optical disk 603.

The microlens actuator 600 according to the fifth embodiment uses the lens holding sections 101a and 101b to support the microlens 602. When the focal position of the laser light 604 deviates from the optical disk 603, for example, an electrostatic attractive force is generated between the protruding section 115a and the lens holding section 101a or between the protruding section 115b and the lens holding section 101b. As a result, the lens holding section 101a or 101b is displaced to adjust the position and tilt of the microlens 602 supported by the lens holding section 101a or 101b. The focal position of the laser light 604 passing through the microlens 602 is adjusted to focus on the optical disk 603.

According to the related art of methods of manufacturing microlens actuators, an intermediate insulation layer is formed on a substrate where a lower electrode is formed. A polysilicon film is deposited on the intermediate insulation layer to form an upper electrode. The intermediate insulation layer immediately below the upper electrode is removed. Alternatively, the substrate forming the lower electrode is bonded to the substrate forming the upper electrode. According to these methods, however, a polysilicon film is deposited to form an upper electrode. The film quality of the upper electrode often becomes uneven. As a result, differences occur in the film stress distribution among upper electrodes. This is inconvenient for the adjustment of microlens focal position. The process of bonding substrates might degrade the production efficiency.

By contrast, the microlens actuator 600 according to the fifth embodiment forms the lens holding sections 101a and 101b without depositing an active layer. The lens holding sections 101a and 101b are formed by processing the active layer 112A that is already formed on the SOI substrate 100S. Unlike the method of depositing the active layer 112A, the fifth embodiment ensures uniform film quality for the lens holding sections 101a and 101b and decreases differences in the film stress distribution between the lens holding sections 101a and 101b. As a result, the microlens actuator 600 according to the fifth embodiment provides an advantage of easily adjusting the focal position of the microlens 602 supported by the lens holding sections 101a and 101b. In addition, the fifth embodiment uses the protruding sections 115a and 115b as both the stopper and the electrodes for displacing the lens holding sections 101a and 101b. The lens holding sections 101a and 101b and the electrodes (protruding sections 115a and 115b) can be formed on a single SOI substrate. The substrate bonding process can be omitted. As a result, the microlens actuator 600 according to the fifth embodiment can improve the production efficiency.

Sixth Embodiment

Figure 29:
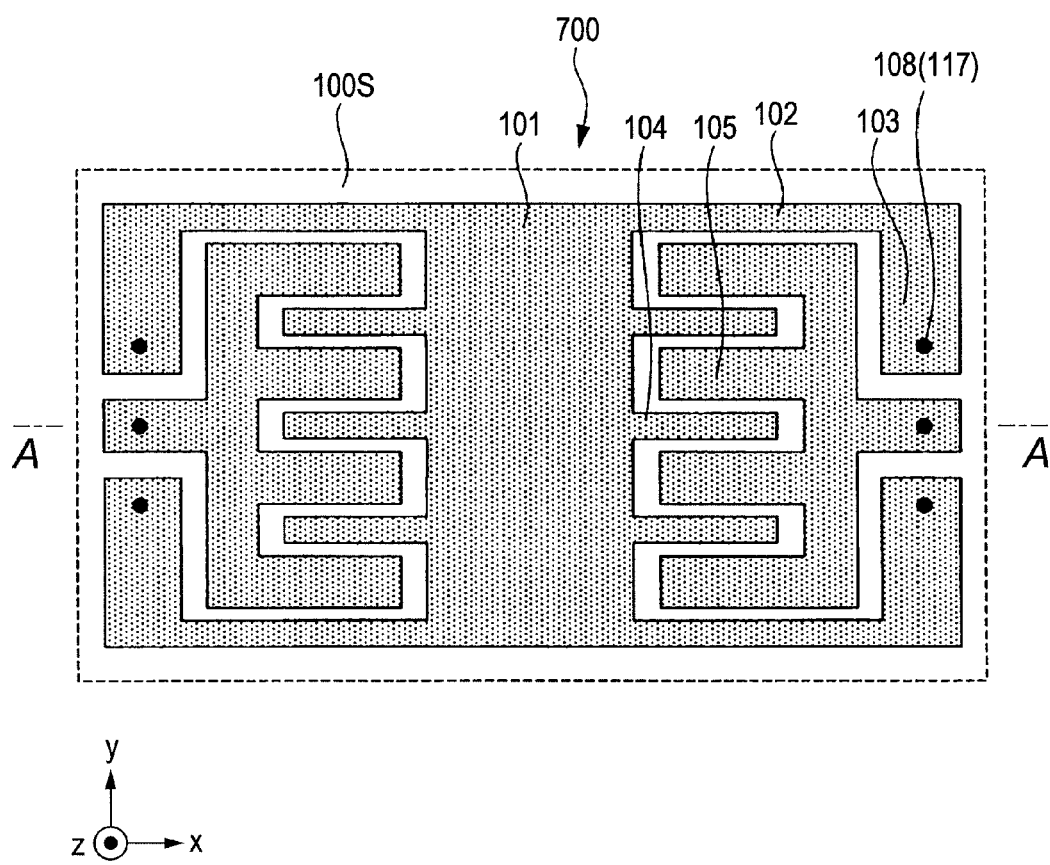
FIG. 29 is a top view showing a configuration of an acceleration sensor according to a sixth embodiment.

The sixth embodiment will describe a modification of the second embodiment. FIG. 29 is a top view showing a configuration of an acceleration sensor 700 according to the sixth embodiment. In FIG. 29, the acceleration sensor 700 according to the sixth embodiment is formed on the SOI substrate 100S. The SOI substrate 100S includes a support substrate, an intermediate insulation layer formed on the support substrate, and an active layer (silicon layer) formed on the intermediate insulation layer. FIG. 29 shows a processed shape of the active layer (silicon layer).

As shown in FIG. 29, the acceleration sensor 700 according to the sixth embodiment includes the movable section 101, the beam (elastic deformation section) 102, and the unmovable section 103. The movable section 101 is connected to the unmovable section 103 through the beam 102. The movable section 101 can be displaced in accordance with acceleration acting on the acceleration sensor 700. Specifically, the beam 102 is configured to be elastically deformable. The movable section 101 is connected to one end of the beam 102. The unmovable section 103 is connected to the other end of the beam 102. For example, applying acceleration in the z direction elastically deforms the beam 102. The movable section 101 connected to the elastically deforming beam 102 is displaced in the z direction. Applying acceleration in the z direction to the acceleration sensor 700 according to the sixth embodiment elastically deforms the beam 102 to displace the movable section 101 in the z direction while the movable section 101 is connected to one end of the beam 102. When acceleration is applied in the z direction to the acceleration sensor 700 according to the sixth embodiment, the movable section 101 is displaced in the z direction in accordance with the magnitude and the direction of the acceleration.

Processing the active layer of, the SOI substrate 100S forms the movable section 101. The intermediate insulation layer formed below the active layer included in the movable section 101 is removed so that the movable section 101 can be displaced. As shown in FIG. 29, the movable section 101 is not provided with an etching hole. For example, the movable section 101 may be provided with an etching hole so as to easily remove the intermediate insulation layer below the movable section 101.

The movable electrode 104 is formed so as to be integrated with the movable section 101. The unmovable electrode 105 is formed so as to face the movable electrode 104. As shown in FIG. 29, for example, three movable electrodes 104 protrude from the right side of the movable section 101. Another three movable electrodes 104 protrude from the left side of the movable section 101. The comblike unmovable electrode 105 is formed so as to face the three movable electrodes 104 protruding from the right side of the movable section 101. The movable electrode 104 and the unmovable electrode 105 form a capacitative element The acceleration sensor 700 according to the sixth embodiment includes the movable section 101 that is connected to the unmovable section 103 through the beam 102. The movable section 101, the beam 102, and the unmovable section 103 are made of conductive active layers (silicon layers). The movable section 101, the beam 102, and the unmovable section 103 are mechanically and electrically connected. The through-hole 108 is formed in the unmovable section 103. The through-hole 108 is embedded with an electrical conducting material to form the through-hole electrode 117.

Similarly, the through-hole 108 is formed in the unmovable electrode 105. The unmovable electrode 105 is embedded with an electrical conducting material to form the through-hole electrode 117.

Figure 30:
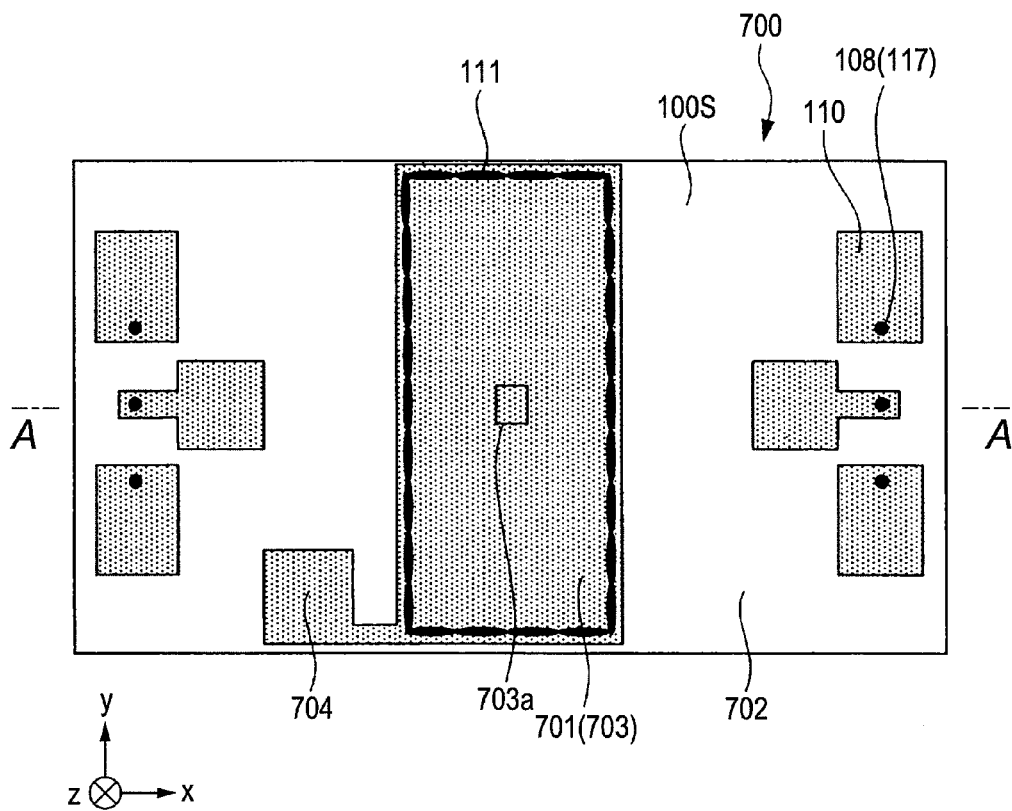
FIG. 30 is a bottom view showing the configuration of the acceleration sensor according to the sixth embodiment.

FIG. 30 is a bottom view showing the configuration of the acceleration sensor 700 according to the sixth embodiment. As shown in FIG. 30, the acceleration sensor 700 according to the sixth embodiment is formed on the SOI substrate 100S. The SOI substrate 100S includes a support substrate, an intermediate insulation layer formed on the support substrate, and an active layer (silicon layer) formed on the intermediate insulation layer. FIG. 30 shows a processed shape on the support substrate side.

As shown in FIG. 30, the through-hole 108 is formed on the support substrate side of the SOI substrate 100S and is filled with an electrical conducting material to form the through-hole electrode 117. The through-hole electrode 117 is electrically connected to the electrode 110 formed on the support substrate. With reference to FIGS. 29 and 30, the movable section 101 in FIG. 29 is electrically connected to the unmovable section 103 through the beam 102. The unmovable section 103 is electrically connected to the electrode 110 formed on the support substrate side through the through-hole electrode 117. Similarly, the unmovable electrode 105 in FIG. 29 is electrically connected to another electrode 110 formed on the support substrate side through another through-hole electrode 117.

As seen from this configuration, the movable section 101 (movable electrode 104) and the unmovable electrode 105 in FIG. 29 are connectable to an external circuit through the discrete electrodes 110.

As shown in FIG. 30, multiple protrusion formation holes 111 are successively formed on the support substrate side of the SOI substrate 100S. The SOI substrate 100S is separated into a separated internal region 701 and a separated external region 702. The separated internal region 701 is surrounded by the successively formed protrusion formation holes 111. The separated external region 702 is formed outside the separated internal region 701. A contact hole 703a is formed in the separated internal region 701. An electrode 703 is formed so as to connect with the contact hole 703a. The electrode 703 is connected to an electrode 704. Accordingly, the separated internal region 701 formed on the SOI substrate 100S is electrically connected to the electrode 704. Applying a given potential to the electrode 704 can apply the potential to the separated internal region 701.

Figure 31:
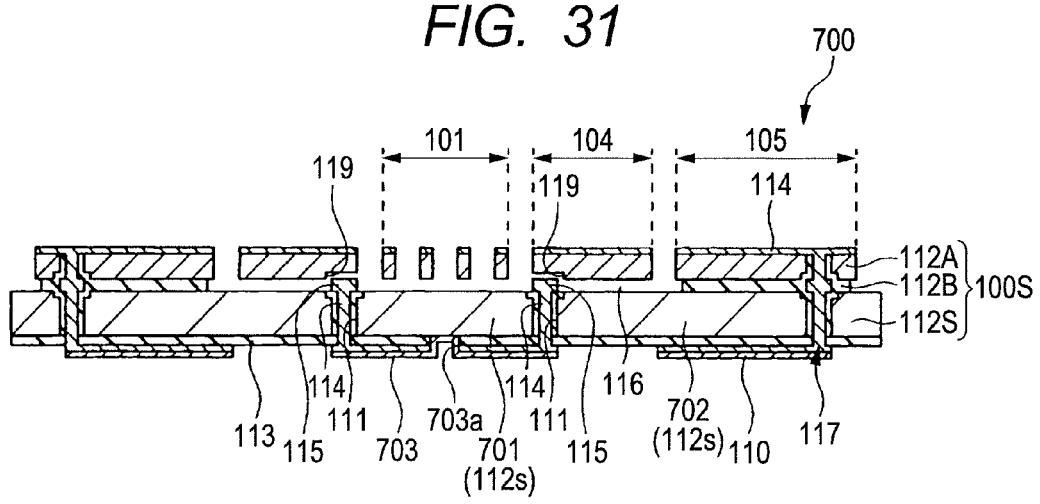
FIG. 31 is a cross sectional view taken along the line A-A of FIGS. 29 and 30.

FIG. 31 is a cross sectional view taken along the line A-A of FIGS. 29 and 30. As shown in FIG. 31, processing the SOI substrate 100S forms the acceleration sensor 700 according to the sixth embodiment. The SOI substrate 100S includes the support substrate 112S, the intermediate insulation layer 112B formed on the support substrate 112S, and the active layer 112A formed on the intermediate insulation layer 112B. Specifically, the acceleration sensor 700 according to the sixth embodiment includes the polysilicon film 114 formed on the active layer (silicon layer) 112A. The active layer 112A and the polysilicon film 114 are integrally processed to form the movable section 101, the movable electrode 104, and the unmovable electrode 105. The intermediate insulation layer 112B below the active layer 112A forming the movable section 101 and the movable electrode 104 is removed to form the gap 116. On the other hand, the intermediate insulation layer 112B formed below the unmovable electrode 105 remains. The unmovable electrode 105 is fixed to the support substrate 112S through the remaining intermediate insulation layer 112B.

Multiple protrusion formation holes 111 are formed so as to pierce the support substrate 112S below the active layer 112A where the movable electrode 104 is formed. The oxide silicon film 113 is formed on the rear surface of the support substrate 112S including inner walls of the protrusion formation holes 111. The polysilicon film 114 is embedded in the protrusion formation hole 111 through the oxide silicon film 113. The polysilicon film 114 embedded in the protrusion formation hole 111 partially bulges out of the protrusion formation hole 111 toward the movable section 101 to form the protruding section 115. According to the sixth embodiment, the protruding section 115 protrudes from the protrusion formation hole 111 into the gap 116 that is formed by removing the intermediate insulation layer 112B. The recessed section 119 is formed in the active layer 112A (movable section 104) above the protruding section 115 so that the protruding section 115 does not contact with the active layer 112A. The polysilicon film 114 embedded in the protrusion formation holes 111 is electrically connected to the electrode 703 formed on the rear surface of the support substrate 112S.

According to the sixth embodiment, the protrusion formation holes 111 are successively formed so as to surround the separated internal region 701 immediately below the movable section 101. The protrusion formation holes 111 separate the separated internal region 701 from the separated external region 702 outside the protrusion formation holes 111. The separated internal region 701 separated by the protrusion formation holes 111 is electrically connected to the electrode 703 through the contact hole 703a.

The unmovable electrode 105 is formed with the through-hole electrode 117 that pierces the support substrate. 112S, the intermediate insulation layer 112B, and the active layer 112A. The active layer 112A is connected to the unmovable electrode 105 (made of the polysilicon film 114) formed on the active layer 112A through the through-hole electrode 117 that pierces the active layer 112A, the intermediate insulation layer 112B, and the support substrate 112S. The through-hole electrode 117 is connected to the electrode 110 formed on the rear surface of the support substrate 112S. Therefore, the through-hole electrode 117 electrically connects the unmovable electrode 105 to the electrode 110 formed on the rear surface of the support substrate 112S.

As a characteristic of the sixth embodiment, the protrusion formation holes 111 are provided so as to pierce the support substrate 112S. The protrusion formation hole 111 is embedded with the polysilicon film 114 as an electrical conducting material through the oxide silicon film 113. The polysilicon film 114 partially bulges out of the protrusion formation hole 111 toward the movable section 101 to form the protruding section 115. In other words, the sixth embodiment is characterized in that the polysilicon film 114 bulges out of the protrusion formation hole 111 toward the movable section 101 to form the protruding section 115. According to the sixth embodiment, the distance between the protruding section 115 and the movable section 101 is shorter than the distance between the support substrate 112S and the movable section 101. This prevents the movable section 101 from contacting with the support substrate 112S. As a result, the movable section 101 can be prevented from sticking to the support substrate 112S.

As a characteristic of the sixth embodiment, the protrusion formation holes 111 are successively formed so as to surround the separated internal region 701 immediately below the movable section 101. The protrusion formation holes 111 separate the separated internal region 701 from the separated external region 702 outside the protrusion formation holes 111. The electrode 704 (see FIG. 30) supplies an electric potential to the separated internal region 701. As described in the second embodiment, a potential difference is applied between the protruding section 115 and the movable section 101 at an initial state. Also in the sixth embodiment, a potential difference is applied between the separated internal region 701 and the movable section 101 at an initial state. As a result, an electrostatic attractive force is generated to reposition the movable electrode 104 formed integrally with the movable section 101 from the unmovable electrode 105. Similarly to the acceleration sensor 300 according to the second embodiment, the acceleration sensor 700 according to the sixth embodiment can also distinguish an acceleration in the +z direction from an acceleration in the −z direction. The sixth embodiment differs from the second embodiment as follows. The second embodiment uses the protruding section 115 itself as an electrode for generating an electrostatic attractive force. On the other hand, the sixth embodiment uses the separated internal region 701 (separated by the successive surrounding protrusion formation holes 111) as an electrode for generating an electrostatic attractive force. Based on this difference, the sixth embodiment can use the whole of the planar separated internal region 701 formed immediately below the movable section 101 as an electrode. The sixth embodiment can generate an electrostatic attractive force more evenly than the second embodiment.

The acceleration sensor 700 according to the sixth embodiment is configured as mentioned above. The manufacturing method for the acceleration sensor 700 is almost the same as that for the acceleration sensor 100 according to the first embodiment. As a difference, the protrusion formation holes 111 are successively formed so as to surround the separated internal region 701 of the support substrate 112S and separate the separated internal region 701 from the separated external region 702. As another difference, the contact hole 703a is formed up to the separated internal region 701. The electrodes 703 and 704 are formed on the rear surface of the support substrate 112S through the contact hole 703a.

The MEMS device manufacturing method according to the sixth embodiment is summarized as follows. (a) Provide the SOI substrate 100S that includes the support substrate 112S, the intermediate insulation layer 112B formed on the support substrate 112S, and the active layer 112A formed on the intermediate insulation layer 112B. (b) After step (a), form multiple protrusion formation holes 111 in the movable section formation region of the SOI substrate 100S so as to pierce the support substrate 112S and expose the intermediate insulation layer 112B. (c) After step (b), remove the intermediate insulation layer 112B exposed from the protrusion formation holes 111 to expose the active layer 112A from the protrusion formation holes 111. (d) After step (c), oxidize the active layer 112A exposed from the protrusion formation holes 111 and inner walls of the protrusion formation holes 111 to form the oxide silicon film 113 on the surface of the active layer 112A and the inner walls of the protrusion formation holes 111. (e) After step (d), embed the polysilicon film 114 in the protrusion formation holes ill. (f) After step (e), pattern the active layer 112A of the SOI substrate 100S to form the beam (elastic deformation section) 102 of a MEMS sensor, the movable section 101 connected to one end of the beam 102, and the unmovable section 103 connected to the other end of the beam 102. (g) After step (f), remove the intermediate insulation layer 112B from the movable section formation region forming the movable section 101 and the elastic deformation section formation region forming the beam 102 to suspend the movable section 101 using the beam 102. Partially expose the polysilicon film 114 embedded in the protrusion formation holes 111 to form the protruding sections 115 that include part of the polysilicon film 114. Remove the oxide silicon film 113 in contact with the protruding sections 115 to form the gap between each of the protruding sections 115 and the movable section 101. Step (b) forms the protrusion formation holes 111 for surrounding the separated internal region 701 in order to electrically separate the separated internal region 701 of the support substrate 112S formed on the SOI substrate 100S from the separated external region 702 of the support substrate 112S formed on the SOI substrate 100S.

While there have been described specific preferred embodiments of the present invention, it is to be distinctly understood that the present invention is not limited thereto but may be otherwise variously embodied within the spirit and scope of the invention.

The invention is widely applicable to MEMS device manufacturing.

What is claimed is:

1. A MEMS device manufacturing method comprising the steps of:
    (a) providing an SOI substrate including a support substrate, an intermediate insulation layer formed on the support substrate, and an active layer formed on the intermediate insulation layer;
    (b) following the step (a) and forming a protrusion formation hole in a movable section formation region of the SOI substrate so as to pierce the support substrate and expose the intermediate insulation layer;
    (c) following the step (b) and removing the intermediate insulation layer exposed from the protrusion formation hole to expose the active layer from the protrusion formation hole;
    (d) following the step (c) and oxidizing the active layer exposed from the protrusion formation hole and an inner wall of the protrusion formation hole to form a first oxidation layer on a surface of the active layer and the inner wall of the protrusion formation hole;
    (e) following the step (d) and embedding a conductive film in the protrusion formation hole;
    (f) following the step (e) and patterning the active layer of the SOI substrate to form an elastic deformation section of a MEMS sensor, a movable section connected to one end of the elastic deformation section, and an unmovable section connected to the other end of the elastic deformation section;
    (g) following the step (f), removing the intermediate insulation layer from the movable section formation region forming the movable section and the elastic deformation section formation region forming the elastic deformation section to suspend the movable section using the elastic deformation section, partially exposing the conductive film embedded in the protrusion formation hole to form a protruding section including part of the conductive film, and removing the first oxidation layer in contact with the protruding section to form a gap between the protruding section and the movable section.

2. The MEMS device manufacturing method according to claim 1,
    wherein the step (b) forms a first hole for through-hole electrode formation in a through-hole electrode formation region of the SOI substrate so as to pierce the support substrate and expose the intermediate insulation layer;
    wherein the step (b) is followed by and the step (c) is preceded by a step of forming a second hole for through-hole electrode formation so as to horizontally overlap with the first hole for through-hole electrode formation, pierce the active layer, and expose the intermediate insulation layer;
    wherein the step (c) removes the intermediate insulation layer exposed from the first hole for through-hole electrode formation and the second hole for through-hole electrode formation to connect the first hole for through-hole electrode formation with the second hole for through-hole electrode formation and form a through-hole piercing the active layer, the intermediate insulation layer, and the support substrate of the SOI substrate;
    wherein the step (d) oxidizes an inner wall of the through-hole to form a second oxidation layer on the inner wall of the through-hole; and
    wherein the step (e) embeds the configuration in the through-hole to form a through-hole electrode.

3. The MEMS device manufacturing method according to claim 1,
    wherein the step (d) forms the first oxidation layer using a thermal oxidation method.

4. A MEMS device manufacturing method comprising the steps of:
    (a) providing an SOI substrate including a support substrate, an intermediate insulation layer formed on the support substrate, and an active layer formed on the intermediate insulation layer;
    (b) following the step (a) and forming a plurality of protrusion formation holes in a movable section formation region of the SOI substrate so as to pierce the support substrate and expose the intermediate insulation layer;
    (c) following the step (b) and removing the intermediate insulation layer exposed from the protrusion formation holes to expose the active layer from the protrusion formation holes;
    (d) following the step (c) and oxidizing the active layer exposed from the protrusion formation holes and inner walls of the protrusion formation holes to form a first oxidation layer on a surface of the active layer and the inner walls of the protrusion formation hole;
    (e) following the step (d) and embedding a conductive film in the protrusion formation holes;
    (f) following the step (e) and patterning the active layer of the SOI substrate to form an elastic deformation section of a MEMS sensor, a movable section connected to one end of the elastic deformation section, and an unmovable section connected to the other end of the elastic deformation section;
    (g) following the step (f), removing the intermediate insulation layer from the movable section formation region forming the movable section and the elastic deformation section formation region forming the elastic deformation section to suspend the movable section using the elastic deformation section, partially exposing the conductive film embedded in the protrusion formation holes to form a plurality of protruding sections including part of the conductive film, and removing the first oxidation layer in contact with the protruding sections to form a gap between the protruding sections and the movable section; and
    wherein the step (b) forms the protrusion formation holes for surrounding a first region of the support substrate formed on the SOI substrate in order to electrically separate the first region from a second region of the support substrate formed on the SOI substrate.

5. The MEMS device manufacturing method according to claim 4,
  wherein the step (b) forms a first hole for through-hole electrode formation in a through-hole electrode formation region of the SOI substrate so as to pierce the support substrate and expose the intermediate insulation layer;
  wherein the step (b) is followed by and the step (c) is preceded by a step of forming a second hole for through-hole electrode formation so as to horizontally overlap with the first hole for through-hole electrode formation, pierce the active layer, and expose the intermediate insulation layer;
  wherein the step (c) removes the intermediate insulation layer exposed from the first hole for through-hole electrode formation and the second hole for through-hole electrode formation to connect the first hole for through-hole electrode formation with the second hole for through-hole electrode formation and form a through-hole piercing the active layer, the intermediate insulation layer, and the support substrate of the SOI substrate;
  wherein the step (d) oxidizes an inner wall of the through-hole to form a second oxidation layer on the inner wall of the through-hole; and
  wherein the step (e) embeds the configuration in the through-hole to form a through-hole electrode.

6. The MEMS device manufacturing method according to claim 4,
  wherein the step (d) forms the first oxidation layer using a thermal oxidation method.

7. A MEMS device comprising:
  (a) an SOI substrate including a support substrate, intermediate insulation layer portions disposed on the support substrate, and an active layer having portions disposed on the intermediate insulation layer portions;
  (b) an elastic deformation section having a first portion of the active layer spaced from the support substrate;
  (c) a movable section having a second portion of the active layer spaced from the support substrate, and being connected to one end of the elastic deformation section;
  (d) an unmovable section having a third portion of the active layer and being fixed to the support substrate through a portion of the intermediate insulation layer below the third portion of the active layer, and being connected to the other end of the elastic deformation section; and
  (e) a stopper section arranged so as to prevent the movable section from sticking to the support substrate.

8. The MEMS device according to claim 7,
  wherein the MEMS device provides a capacitance acceleration sensor;
  wherein the capacitance acceleration sensor includes:
  an unmovable electrode; and
  a movable electrode formed integrally with the movable section;
  wherein an electrostatic capacitative element is formed by placing the unmovable electrode and the movable electrode so as to face to each other in an in-plane direction of the SOI substrate; and
  wherein the capacitance acceleration sensor is supplied with an acceleration in the in-plane direction of the SOI substrate and detects the acceleration supplied in the in-plane direction based on a change in capacitance of the electrostatic capacitative element in accordance with a change in the distance between the unmovable electrode and the movable electrode in the in-plane direction.

9. The MEMS device according to claim 7,
  wherein the MEMS device provides a capacitance acceleration sensor;
  wherein the capacitance acceleration sensor includes:
  an unmovable electrode; and
  a movable electrode formed integrally with the movable section;
  wherein an electrostatic capacitative element is formed by placing the unmovable electrode and the movable electrode so as to face to each other in an in-plane direction of the SOI substrate; and
  wherein the capacitance acceleration sensor is supplied with an acceleration in a thickness direction of the SOI substrate and detects the acceleration supplied in the thickness direction based on a change in capacitance of the electrostatic capacitative element in accordance with a change in an overlapping area between a side of the unmovable electrode and a side of the movable electrode.

10. The MEMS device according to claim 9,
  wherein the stopper section is placed so as to horizontally overlap with the movable section; and
  wherein the capacitance acceleration sensor is configured to displace the movable electrode from a balanced position in the thickness direction based on an electrostatic force generated by applying a potential difference between the movable section and the stopper section even at an initial state where no acceleration is applied in the thickness direction of the SOI substrate.

11. The MEMS device according to claim 7,
  wherein the MEMS device provides a capacitance acceleration sensor;
  wherein the capacitance acceleration sensor includes:
  a plurality of the stopper sections that horizontally overlap with the movable section and maintain an equal potential between themselves; and
  an electrostatic capacitative element using the movable section as an upper electrode and the stopper sections as a lower electrode; and
  wherein the capacitance acceleration sensor detects an acceleration applied in the thickness direction of the SOI substrate based on a change in capacitance of the electrostatic capacitative element in accordance with a change in a distance between the movable section as the upper electrode and the stopper sections as the lower electrode in the thickness direction.

12. The MEMS device according to claim 7,
  wherein the MEMS device provides a micromirror using the movable section as a mirror;
  wherein the micromirror is provided with the stopper section so as to horizontally overlap with the movable section used as the mirror; and
  wherein the micromirror adjusts an angle of the movable section based on an electrostatic force generated by applying a potential difference between the movable section and the stopper section.

13. The MEMS device according to claim 7,
  wherein the MEMS device provides a microlens actuator;
  wherein the microlens actuator includes:
  a microlens; and
  a lens holding section for holding the microlens;
  wherein the lens holding section integrally includes the unmovable section, the elastic deformation section, and the movable section;
  wherein the microlens actuator is provided with the stopper section so as to horizontally overlap with the lens holding section; and wherein the microlens actuator adjusts a position of the microlens by displacing the lens holding section based on an electrostatic force generated by applying a potential difference between the lens holding section and the stopper section.

14. The MEMS device according to claim 7, comprising:
a plurality of the stopper sections,
wherein the stopper sections are formed so as to surround a first region of the support substrate formed on the SOI substrate in order to electrically separate the first region from a second region formed on the SOI substrate other than the first region.

15. The MEMS device according to claim 14,
wherein the MEMS device provides a capacitance acceleration sensor;
wherein the capacitance acceleration sensor includes:
an unmovable electrode; and
a movable electrode formed integrally with the movable section;
wherein an electrostatic capacitative element is formed by placing the unmovable electrode and the movable electrode so as to face to each other in an in-plane direction of the SOI substrate;
wherein the capacitance acceleration sensor is supplied with an acceleration in a thickness direction of the SOI substrate and detects the acceleration supplied in the thickness direction based on a change in capacitance of the electrostatic capacitative element in accordance with a change in an overlapping area between a side of the unmovable electrode and a side of the movable electrode;
wherein the first region is provided so as to horizontally overlap with the movable section; and
wherein the capacitance acceleration sensor is configured to displace the movable electrode formed integrally with the movable section from a balanced position in the thickness direction based on an electrostatic force generated by applying a potential difference between the movable section and the first region even at an initial state where no acceleration is applied in the thickness direction of the SOI substrate.

16. The MEMS device according to claim 7,
wherein the stopper section includes:
a protrusion formation hole piercing the support substrate;
an oxidation layer formed on an inner wall of the protrusion formation hole;
a conductive film embedded in the protrusion formation hole through the oxidation layer; and
a protruding section including part of the conductive film bulging out of the protrusion formation hole toward the movable section, and
wherein a distance between the protruding section and the movable section is smaller than a distance between the support substrate and the movable section.

* * * * *